United States Patent [19]

Saitoh et al.

[11] Patent Number: 4,609,604

[45] Date of Patent: Sep. 2, 1986

[54] PHOTOCONDUCTIVE MEMBER HAVING A GERMANIUM SILICON PHOTOCONDUCTOR

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 643,441

[22] Filed: Aug. 23, 1984

[30] Foreign Application Priority Data

Aug. 26, 1983 [JP] Japan ................... 58-156682
Dec. 20, 1983 [JP] Japan ................... 58-240022
Dec. 20, 1983 [JP] Japan ................... 58-240023
Dec. 22, 1983 [JP] Japan ................... 58-242654

[51] Int. Cl.$^4$ ........................................... G03G 5/085
[52] U.S. Cl. ........................................ 430/57; 430/84; 430/95
[58] Field of Search .................... 430/57, 65, 84, 95

[56] References Cited

U.S. PATENT DOCUMENTS 4,451,546  5/1984  Kawamura et al. ................... 430/57
4,490,430 12/1984  Shimizu et al. ....................... 430/84
4,491,626  1/1985  Kawamura et al. ................... 430/57
4,513,073  4/1985  Jeffrey et al. ........................ 430/65

Primary Examiner—John L. Goodrow
Attorney, Agent, or Firm—Fitzpatrick, Cella, Harper & Scinto

[57] ABSTRACT

A photoconductive member comprises a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing a substance for controlling conductivity (C) in a distributed state such that, in said light receiving layer, the maximum value of the content of said substance (C) in the layer thickness direction exists within said second layer region (S) or at the interface with said first layer region (G) and, in said second layer region (S), said substance (C) is distributed in greater amount on the side of said substrate.

58 Claims, 29 Drawing Figures

PHOTOCONDUCTIVE MEMBER HAVING A GERMANIUM SILICON PHOTOCONDUCTOR

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays, gamma-rays, and the like].

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio [photocurrent $(I_p)$/dark current $(I_d)$], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characterisitcs such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot sufficiently impeded.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light receiving layer exhibiting photoconductivity, which comprises an amorphous material containing at least one of hydrogen atom (H) and halogen atom (X) in a matrix of silicon atoms such as so called hydrogenated amorphous silicon, halogenated amorphous silicon or halogen-containing hydrogenated amorphous silicon [hereinafter referred to comprehensively as a-Si(H,X)], said photoconductive member being prepared by designing so as to have a specific structure as hereinafter described, not only exhibits practically extremely excellent characteristics but also surpass the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environments under use, which member is markedly excellent in photosensitive characteristics on the longer wavelength side and light fatigue resistance and also excellent in durability without causing deterioration phenomenon when used repeatedly, exibiting no or substantially no residual potential observed.

Another object of the present invention is to provide a photoconductive member which is high in photosensitivity throughout the whole visible light region, particularly excellent in matching to a semiconductor laser and also rapid in response to light.

Still another object of the present invention is to provide a photoconductive member having sufficient charge retentivity during charging treatment for formation of electrostatic images to the extent such that a conventional electrophotographic method can be very effectively applied when it is provided for use as an image forming member for electrophotography.

Further, still another object of the present invention is to provide a photoconductive member for electrophotography, which can easily provide an image of high quality which is high in density, clear in halftone, high in resolution and free from "unfocused" image.

Still another object of the present invention is to provide a photoconductive member having high photosensitivity and high SN ratio characteristic.

According to the present invention, there is provided a photoconductive member comprising a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing a substance for controlling conductivity (C) in a distributed state such that, in said light receiving layer, the maximum value of the content of said substance (C) in the layer thickness direction exists within said second layer region (S) or at the interface with said first layer region (G) and, in said second layer region (S), said substance (C) is distributed in greater amount on the side of said substrate.

DETAILED DESCRIPTION OF THE PREFERRED EMBODIMENTS

Figure 1:
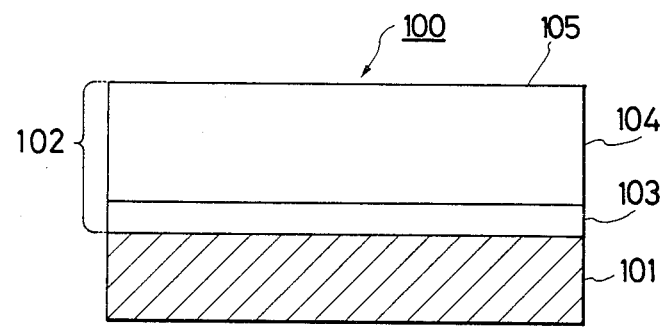
FIG. 1 and FIG. 25 each shows a schematic sectional view for illustration of the layer constitution of a preferred embodiment of the photoconductive member according to the present invention.

Referring now to the drawings, the photoconductive members according to the present invention are to be described in detail below.

FIG. 1 shows a schematic sectional view for illustration of the layer constitution of a first embodiment of the photoconductive member of this invention.

The photoconductive member 100 as shown in FIG. 1 is constituted of a light receiving layer 102 formed on a substrate 101 for photoconductive member, said light receiving layer 102 having a free surface 105 on one end surface.

The light receiving layer 102 has a layer structure constituted of a first layer region (G) 103 consisting of germanium atoms and, if desired, at least one of silicon atoms (Si), hydrogen atoms (H) and halogen atoms (X) (hereinafter abbreviated as "a-Ge(Si, H,X)" and a second layer region (S) 104 having photoconductivity consisting of a-Si(H,X) laminated successively from the substrate side 101.

The light receiving layer 102 contains a substance for controlling conductivity (C), said substance (C) being contained in a distributed state such that, in the light receiving layer 102, the maximum value of the content of said substance (C) in the layer thickness direction exists in the second layer region (S) and, in the second layer region (S), it is distributed in greater amount on the side of the substrate 101.

The germanium atoms contained in the first layer region (G) are contained in uniform state in the interplanar direction in parallel to the surface of the substrate, but may be either uniform or ununiform in the layer thickness direction.

Also, when the distribution of germanium atoms contained in the first layer region (G) is ununiform, it is desirable that the content C(G) in the layer thickness direction should be changed toward the substrate side or the side of the second layer region (S) gradually or stepwise, or linearly.

Particularly, in the case where the distribution of germanium atoms in the first layer region (G) is varied such that germanium atoms are distributed continuously over all the layer region with the content C(G) of germanium atoms in the layer thickness direction being reduced from the substrate side to the second layer region (S), affinity between the first layer region (G) and the second layer region (S) is excellent. Also, as described hereinafter, by increasing the content C(G) of germanium atoms at the end portion on the substrate side extremely great, the light on the longer wavelength side which cannot substantially be absorbed by the second layer region (S) can be absorbed in the first layer region (G) substantially completely, when employing a semiconductor laser, whereby interference by reflection from the substrate surface can be prevented and reflection against the interface between the layer region (G) and the layer region (S) can sufficiently be suppressed.

Also, in the photoconductive member of the present invention, the respective amorphous materials constituting the first layer region (G) and the second layer region (S) have the common constituent of silicon atoms, and therefore chemical stability can be sufficiently ensured at the laminated interface.

The photoconductive member designed to have layer constitution of the present invention as described above can overcome all of the problems as mentioned above and exhibit very excellent electrical, optical, photoconductive characteristics, dielectric strength as well as good environmental characteristics in use.

In particular, when it is applied as an image forming member for electrophotography, interference can sufficiently be prevented even by use of a light capable of interference without any influence of residual potential on image formation at all, its electrical properties being stable with high sensitivity, and the photoconductive member has high SN ratio as well as excellent light fatigue resistance and repeated usage characteristics, whereby it is possible to obtain repeatedly and stably images of high quality with high density, clear halftone and high resolution.

Further, the photoconductive member of the present invention is high in photosensitivity over the all visible light regions, particularly excellent in matching to semiconductor laser and also rapid in light response.

FIGS. 2 through 10 show typical examples of ununiform distibution in the direction of layer thickness of germanium atoms contained in the first layer region (G) of the photoconductive member in the present invention.

In FIGS. 2 through 10, the abscissa indicates the content C of germanium atoms and the ordinate the layer thickness of the first layer region (G), $t_B$ showing the position of the end surface of the first layer region (G) on the substrate side and $t_T$ the position of the end surface of the first layer region (G) on the side opposite to the substrate side. That is, layer formation of the first layer region (G) containing germanium atoms proceeds from the $t_B$ side toward the $t_T$ side.

Figure 2:
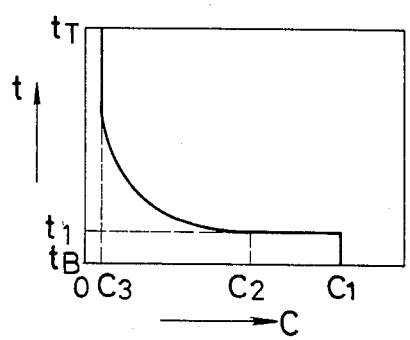
FIGS. 2 to 10 each shows a schematic illustration of the depth profiles of germanium atoms in the first layer region (G)

In FIG. 2, there is shown a first typical embodiment of the depth profile of germanium atoms in the layer thickness direction contained in the first layer region (G).

In the embodiment as shown in FIG. 2, from the interface position $t_B$ at which the surface, on which the first layer region (G) containing germanium atoms is to be formed, is contacted with the surface of said first layer region (G) to the position $t_1$, germanium atoms are contained in the first layer region (G) formed, while the content C(G) of germanium atoms taking a constant value of $C_1$, the content being gradually decreased from the content $C_2$ continuously from the position $t_1$ to the interface position $t_T$. At the interface position $t_T$, the content C(G) of germanium atoms is made $C_3$.

Figure 3:
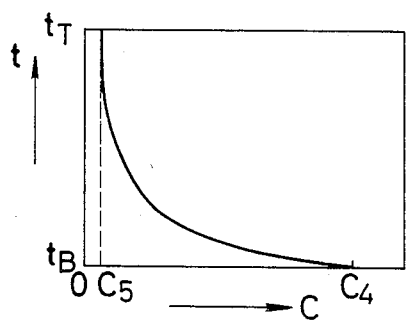

In the embodiment shown in FIG. 3, the content C(G) of germanium atoms contained is decreased gradually and continuously from the position $t_B$ to the position $t_T$ from the content $C_4$ until it becomes the content $C_5$ at the position $t_T$.

Figure 4:
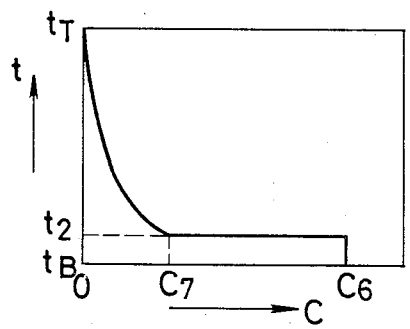

In case of FIG. 4, the content C(G) of germanium atoms is made constant as $C_6$, gradually decreased continuously from the position $t_2$ to the position $t_T$, and the content C(G) is made substantially zero at the position $t_T$ (substantially zero herein means the content less than the detectable limit).

Figure 5:
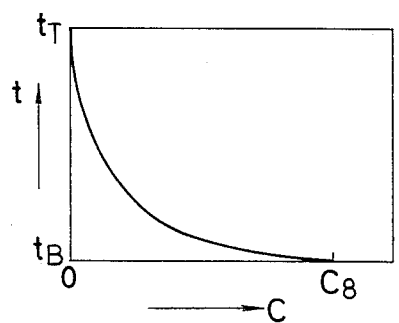

In case of FIG. 5, the content C(G) of germanium atoms are decreased gradually and continuously from the position $t_B$ to the position $t_T$ from the content $C_8$, until it is made substantially zero at the position $t_T$.

Figure 6:
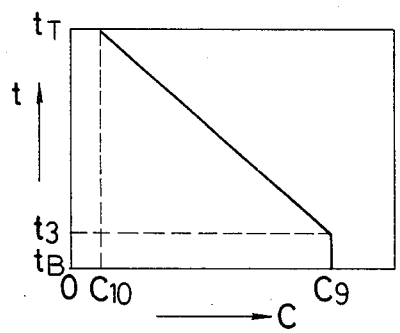

In the embodiment shown in FIG. 6, the content C(G) of germanium atoms is constantly $C_9$ between the position $t_B$ and the position $t_3$, and it is made $C_{10}$ at the position $t_T$. Between the position $t_3$ and the position $t_T$, the content is reduced as a first order function from the position $t_3$ to the position $t_T$.

Figure 7:
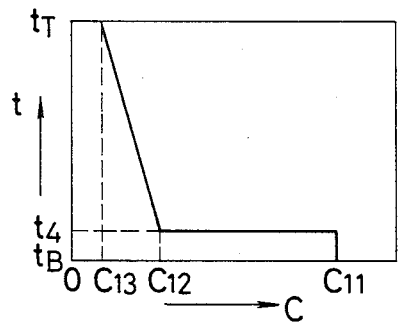

In the embodiment shown in FIG. 7, there is formed a depth profile such that the content C(G) takes a constant value of $C_{11}$ from the position $t_B$ to the position $t_4$, and is decreased as a first order function from the content $C_{12}$ to the content $C_{13}$ from the position $t_4$ to the position $t_T$.

Figure 8:
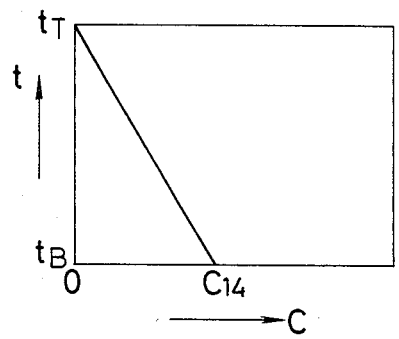

In the embodiment shown in FIG. 8, the content C(G) of germanium atoms is decreased as a first order function from the content $C_{14}$ to zero from the position $t_B$ to the position $t_T$.

Figure 9:
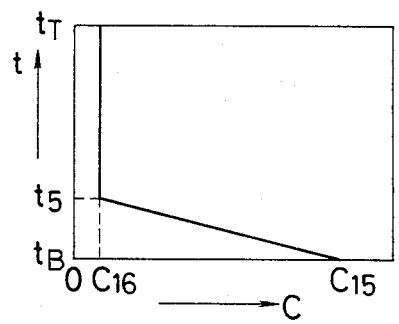

In FIG. 9, there is shown an embodiment, where the content C(G) of germanium atoms is decreased as a first order function from the content $C_{15}$ to $C_{16}$ from the position $t_B$ to $t_5$ and made constantly at the content $C_{16}$ between the position $t_5$ and $t_T$.

Figure 10:
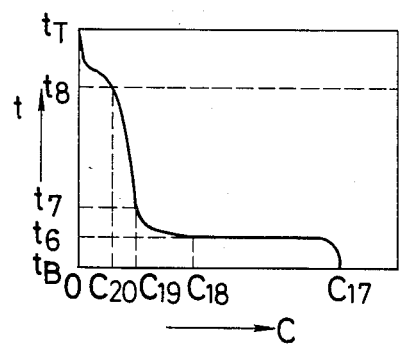

In the embodiment shown in FIG. 10, the content C(G) of germanium atoms is at the content $C_{17}$ at the position $t_B$, which content $C_{17}$ is initially decreased gradually and abruptly near the position $t_6$ to the position $t_6$, until it is made the content $C_{18}$ at the position $t_6$.

Between the position $t_6$ and the position $t_7$, the content C(G) is initially decreased abruptly and thereafter gradually, until it is made the content $C_{19}$ at the position $t_7$. Between the position $t_7$ and the position $t_8$, the content is decreased very gradually to the content $C_{20}$ at the position $t_8$. Between the position $t_8$ and the position $t_T$, the content is decreased along the curve having a shape as shown in the Figure from the content $C_{20}$ to substantially zero.

As described above about some typical examples of depth profiles of germanium atoms contained in the first layer region (G) in the direction of the layer thickness by referring to FIGS. 2 through 10, in the preferred embodiment of the present invention, the first layer region (G) is provided desirably in a depth profile so as to have a portion enriched in content C(G) of germanium atoms on the substrate side and a portion depleted in content C(G) of germanium atoms to considerably lower than that of the substrate side on the interface $t_T$ side.

The first layer region (G) constituting the light receiving layer of the photoconductive member in the present invention is desired to have a localized region (A) containing germanium atoms preferably at a relatively higher content on the substrate side as described above.

The localized region (A), as explained in terms of the symbols shown in FIG. 2 through FIG. 10, may be desirably provided within 5 $\mu$ from the interface position $t_B$.

In the present invention, the above localized region (A) may be made to be identical with the whole layer region ($L_T$) up to the depth of 5 $\mu$ from the interface position $t_B$, or alternatively a part of the layer region ($L_T$).

It may suitably be determined depending on the characteristics required for the amorphous layer to be formed, whether the localized region (A) is made a part or whole of the layer region ($L_T$).

The localized region (A) may preferably be formed according to such a layer formation that the maximum value Cmax of the content of germanium atoms in a distribution in the layer thickness direction may preferably be 1000 atomic ppm or more, more preferably 5000 atomic ppm or more, most preferably $1 \times 10^4$ atomic ppm or more based on the sum of germanium atoms and silicon atoms.

That is, according to the present invention, the layer region (G) containing germanium atoms is formed so that the maximum value Cmax of the content C(G) may exist within a layer thickness of 5 $\mu$ from the substrate side (the layer region within 5 $\mu$ thickness from $t_B$).

In the present invention, the content of germanium atoms in the first layer region (G) containing germanium atoms, which may suitably be determined as desired so as to achieve effectively the objects of the present invention, may preferably be 1 to $10 \times 10^5$ atomic ppm, more preferably 100 to $9.5 \times 10^5$ atomic ppm, most preferably 500 to $8 \times 10^5$ atomic ppm.

In the photoconductive member of the present invention, the layer thickness of the first layer region (G) and the thickness of the second layer region (S) are one of important factors for accomplishing effectively the object of the present invention and therefore sufficient care should be paid in designing of the photoconductive member so that desirable characteristics may be imparted to the photoconductive member formed.

In the present invention, the layer thickness $T_B$ of the first layer region (G) may preferably be 30 Å to 50 $\mu$, more preferably 40 Å to 40 $\mu$, most preferably 50 Å to 30 $\mu$.

On the other hand, the layer thickness T of the second layer region (S) may be preferably 0.5 to 90 $\mu$, more preferably 1 to 80 $\mu$, most preferably 2 to 50 $\mu$.

The sum of the layer thickness $T_B$ of the first layer region (G) and the layer thickness T of the second layer region (S), namely ($T_B+T$) may be suitably determined as desired in designing of the layers of the photoconductive member, based on the mutual organic relationship between the characteristics required for both layer regions and the characterisitcs required for the whole light receiving layer.

In the photoconductive member of the present invention, the numerical range for the above ($T_B+T$) may preferably be from 1 to 100 $\mu$, more preferably 1 to 80 $\mu$, most preferably 2 to 50 $\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer region (G) is $1 \times 10^5$ atomic ppm or more, the layer thickness $T_B$ of the first layer region (G) should desirably be made as thin as possible, preferably 30 $\mu$ or less, more preferably 25 $\mu$ or less, most preferably 20 $\mu$ or less.

In the present invention, illustrative of halogen atoms (X), which may optionally be incorporated in the first layer region (G) and/or the second layer region (S) constituting the light receiving layer, are fluorine, chlorine, bromine and iodine, particularly preferably fluorine and chlorine.

In the present invention, formation of the first layer region (G) constituted of a-Ge(Si,H,X) may be conducted according to the vacuum deposition method utilizing discharging phenomenon, such as glow discharge method, sputtering method or ion-plating method. For example, for formation of the first layer region (G) constituted of a-Ge(Si,H,X) according to the glow discharge method, the basic procedure comprises introducing a starting gas for Ge supply capable of supplying germanium atoms (Ge) optionally together with a starting gas for Si supply capable of supplying silicon atoms (Si), and a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position. For distributing ununiformly the germanium atoms, a layer consisting of a-Ge(Si,H,X) may be formed while controlling the depth profile of germanium atoms according to a desired change rate curve. Alternatively, for formation according to the sputtering method, when carrying out sputtering by use of a target constituted of Si or two sheets of targets of said target and a target constituted of Ge, or a target of a mixture of Si and Ge in an atmosphere of an inert gas such as Ar, He, etc. or a gas mixture based on these gases, a starting gas for Ge supply optionally together with, if desired, a gas for introduction of hydrogen atoms (H) and/or a gas for introduction of halogen atoms (X) may be introduced into a deposition chamber for sputtering, thereby forming a plasma atmosphere of a deisred gas, and sputtering of the aforesaid target may be effected, while controlling the gas flow rates of the starting gas for supply of Ge and/or the starting gas for supply of Si according to a desired change rate curve.

In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogenic compounds, as exemplified preferably by gaseous or gasifiable halogenic compounds such as halogenic gases, halides, interhalogen compounds, silane derivatives substituted with halogens and the like.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is formed according to the glow discharge method by emplyment of such a silicon compound containing halogen atoms, it is possible to form the first layer region (G) comprising a-SiGe containing halogen atoms on a desired substrate without use of a hydrogenated silicon gas as the starting gas capable of supplying Si together with the starting gas for Ge supply.

In the case of forming the first layer region (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer region (G) and exciting glow discharge to form a plasma atmosphere of these gases, whereby the first layer region (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer region (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the first layer region (G).

For introducing hydrogen atoms structurally into the first layer region (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer region (G) constituting the photoconductive layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer region (G), for example, the substrate temperature and/or the amount of the starting materials used for incorporation of hydrogen atoms (H) or halogen atoms (X) to be introduced into the deposition device system, discharging power, etc. may be controlled.

In the photoconductive member of the present invention, by incorporating a substance (C) for controlling conductivity in the second layer region (S) containing no germanium atom and in the first layer region (G) containing germanium atoms, the conductivities of said layer region (S) and said layer region (G) can be controlled freely as desired.

The above substance (C) contained in the second layer region (S) may be contained in either the whole region or a part of the layer region (S), but it is required that it should be distributed more enriched toward the substrate side.

More specifically, the layer region (SPN) containing the substance (C) provided in the second layer region (S) is provided throughout the whole layer region of the second layer region (S) or as an end portion layer region (SE) on the substrate side as a part of the second layer region (S). In the former case of being provided as the whole layer region, it is provided so that its content C(s) may be increased toward the substrate side linearly, stepwise or in a curve.

When the content C(s) is increased in a curve, it is desirable that the substance (C) for contorlling conductivity should be provided in the layer region (S) so that it may be increased monotonously toward the substrate side.

In the case of providing the layer region (SPN) in the second layer region as a part thereof, the distributed state of the substance (C) in the layer region (SPN) is made uniform in the interplanar direction parallel to the surface of the substrate, but it may be either uniform or ununiform in the layer thickness direction. In this case, in the layer region (SPN), for making the substance (C) distributed ununiformly in the layer thickness direction, it is desirable that the depth profile of the substance (C) should be similar to that in the case of providing it in the whole region of the second layer region (S).

Provision of a layer region (GPN) containing a substance for controlling conductivity (C) in the first layer region (G) can also be done similarly as provision of the layer region (SPN) in the second layer region (S).

In the present invention, when the substance (C) for controlling conductivity is contained in both of the first layer region (G) and the second layer region (S), the substances (C) to be contained in both layer regions may be either of the same kind or of different kinds.

However, when the same kind of the substance (C) is contained in both layer regions, it is preferred that the maximum content of said substance (C) in the layer thickness direction should be in the second layer region (S), namely internally within the second layer region (S) or at the interface with the first layer region (G).

In particular, it is desirable that the aforesaid maximum content should be provided at the contacted interface with the first layer region (G) or in the vicinity of said interface.

In the present invention, by incorporating a substance (C) for controlling conductivity in the light receiving layer as described above, the layer region (PN) containing said substance (C) is provided so as to occupy at least a part of the second layer region (S), preferably as an end portion layer region (SE) on the substrate side of the second layer region (S).

When the layer region (PN) is provided so as to bridge both of the first layer region (G) and the second layer region (S), the substance (C) is incorporated in the light receiving layer so that the maximum content $C_{(G)max}$ of the substance (C) for controlling conductivity in the layer region (GPN) and the maximum $C_{(S)max}$ in the layer region (SPN) may satisfy the relation of $C_{(G)max} < C_{(S)max}$.

At a substance (C) for controlling conductivity characteristics, there may be mentioned so called impurities in the field of semiconductors. In the present invention, there may be included p-type impurities giving p-type conductivity characteristics and n-type impurities giving n-type conductivity characteristics to Si or Ge.

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table (Group V atoms), such as P (phosphorus), As (arsenic), Sb (antimony), Bi (bismuth), etc., particularly preferably P and As.

In the present invention, the content of the substance (C) for controlling conductivity in the layer region (PN) provided in the light receiving layer may be suitably be selected depending on the conductivity required for said layer region (PN), or the characteristics at the contacted interface at which said layer region (PN) is contacted directly with other layer region or the substrate, etc. Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by providing the layer region (PN) containing the substance (C) for controlling conductivity so as to be in contact with the contacted interface between the first layer region (G) and the second layer region (S) or so that a part of the layer region (PN) may occupy at least a part of the first layer region (G), and making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the second layer region (S) can be effectively inhibited when the free surface of the light receiving layer is subjected to the charging treatment to ⊕ polarity. On the other hand, when the substance (C) to be incorporated is a n-type impurity, migration of positive holes injected from the substrate side into the second layer region (S) can be effectively inhibited when the free surface of the light receiving layer is subjected to the charging treatment to ⊖ polarity.

In the case as mentioned above, the layer region (Z) at the portion excluding the above layer region (PN) under the basic constitution of the present invention as described above may contain a substance for controlling conductivity of the other polarity, or a substance for controlling conductivity characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

As different from the cases as mentioned above, in the present invention, it is also possible to provide a layer region containing a substance for controlling conductivity having one polarity and a layer region containing a substance for controlling conductivity having the other polarity in direct contact with each other in the light receiving layer, thus providing a so called depletion layer at said contact region. In short, for example, a layer region containing the aforesaid p-type impurity and a layer region containing the aforesaid n-type impurity are provided in the light receiving layer in direct contact with each other to form the so called p-n junction, whereby a depletion layer can be provided.

FIGS. 11 through 24 show typical examples of depth profiles in the layer thickness direction of the substance (C) for controlling conductivity to be contained in the light receiving layer.

In these Figures, the abscissa indicates the content $C_{(PN)}$ of the substance (C) in the layer thickness direction, and the ordinate the layer thickness t of the light receiving layer from the substrate side. $t_0$ shows the contacted interface between the layer region (G) and the layer region (S).

Also, the symbols employed in the abscissa and the ordinate have the same meanings as employed in FIG. 2 through 10, unless otherwise noted.

Figure 11:
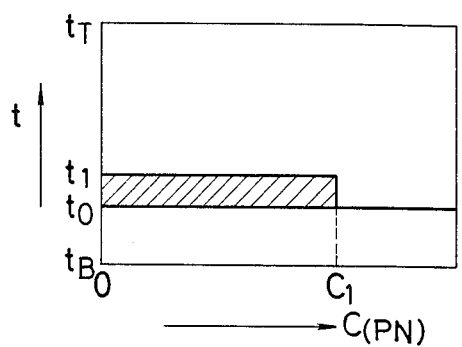
FIGS. 11 through 24 each shows a schematic illustration of the depth profiles of impurity atoms in the first layer (I)

FIG. 11 shows a typical embodiment of the depth profile in the layer thickness direction of the substance (C) for controlling conductivity contained in the light reveiving layer.

In the embodiment shown in FIG. 11, the substance (C) is not contained in the layer region (G), but only in the layer region (S) at a constant content of $C_1$. In short, in the layer region (S), at the end portion layer region between $t_0$ and $t_1$, the substance (C) is contained at a constant content of $C_1$.

Figure 12:
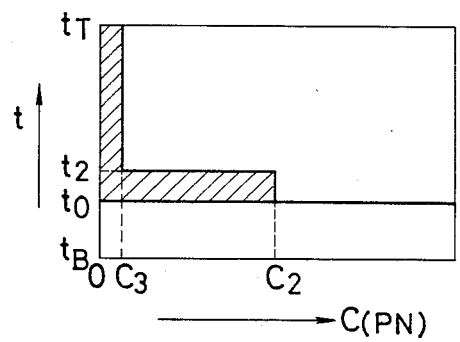

In the embodiment in FIG. 12, while the substance (C) is evenly contained in the layer region (S), but no substance (C) is contained in the layer region (G).

And, the substance (C) is contained in the layer region between $t_0$ and $t_2$ at a constant content of $C_2$, while in the layer region between $t_2$ and $t_T$ at a constant content of $C_3$ which is by far lower than $C_2$.

By having the substance (C) at such a content $C_{(PN)}$ incorporated in the layer region (S), migration of charges injected from the layer region (G) to the layer region (S) in the direction of the free surface can effectively be inhibited, and at the same time photosensitivity and dark resistance can be improved.

Figure 13:
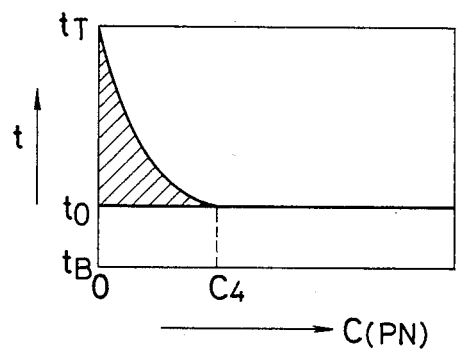

In the embodiment of FIG. 13, the substance (C) is evenly contained in the layer region (S), but the substance (C) is contained in a state such that the content $C_{(PN)}$ is changed while being reduced monotonously from the content $C_4$ at $t_0$ until becoming the content 0 at $t_T$. No substance (C) is contained in the layer region (G).

Figure 14:
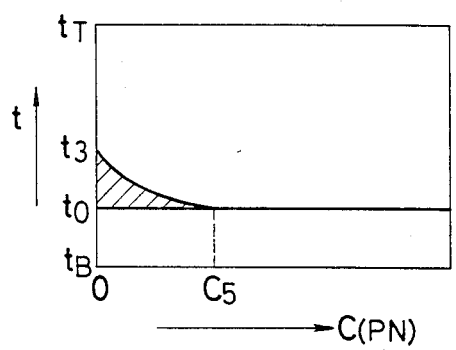
Figure 15:
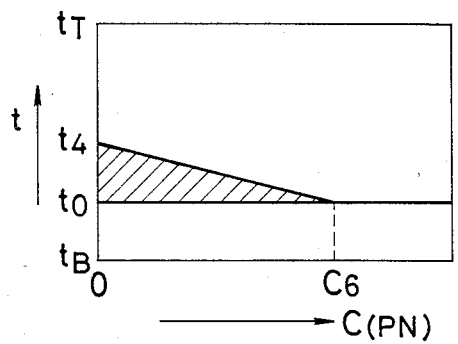
Figure 16:
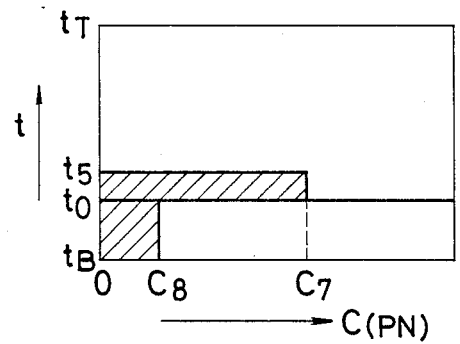
Figure 17:
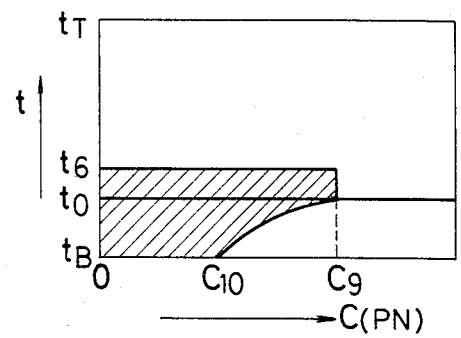
Figure 18:
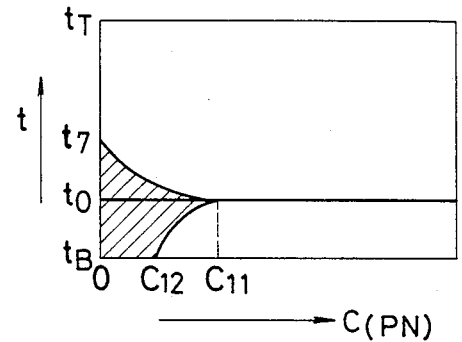
Figure 19:
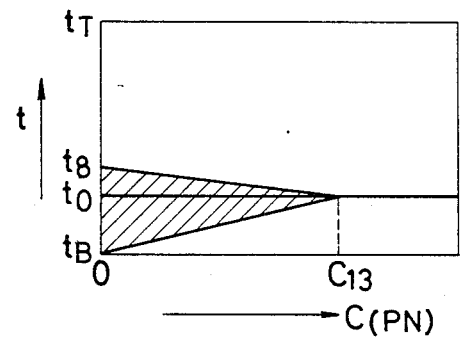
Figure 20:
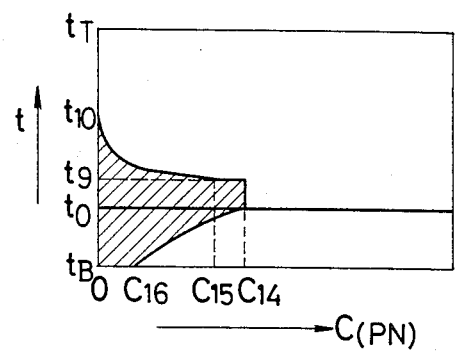
Figure 21:
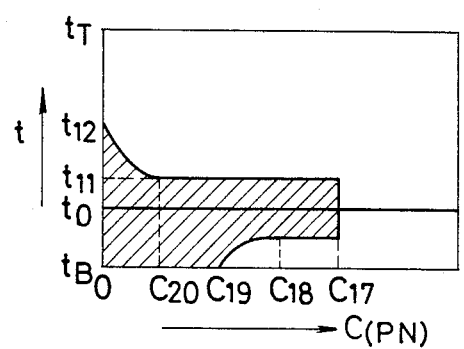
Figure 22:
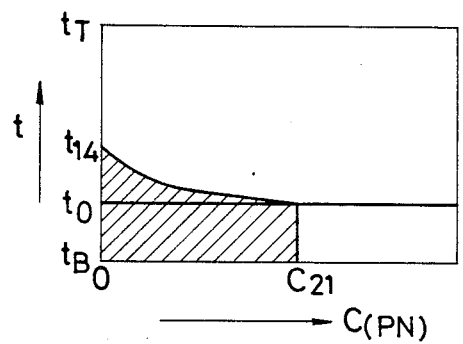

In the case of the embodiments shown in FIG. 14 and FIG. 15, the substance (C) is contained locally in the layer region at the lower end portion of the layer region (S). Thus, in the case of embodiments of FIG. 14 and FIG. 15, the layer region (S) has a layer structure, in which the layer region containing the substance (C) and the layer region containing no substance (C) are laminated in this order from the substrate side.

The difference between the embodiments of FIG. 14 and FIG. 15 is that the content $C_{(PN)}$ is reduced from the content $C_5$ at the position $t_0$ to the content 0 at the position $t_3$ monotonously in a curve between $t_0$ and $t_3$ in the case of FIG. 14, while, in the case of FIG. 15, between $t_0$ and $t_4$, the content is reduced continuously and linearly from the content $C_6$ at the position $t_0$ to the content 0 at the position $t_4$. In both embodiments of FIG. 14 and FIG. 15, no substance (C) is contained in the layer region (G).

In the embodiments shown in FIGS. 16 through 24, the substance (C) for controlling conductivity is contained in both the layer region (G) and the layer region (S).

In the case of FIGS. 16 through FIG. 22, the layer regions (S) commonly possess the two-layer structure, in which the layer region containing the substance (C) and the layer region containing no substance (C) are laminated in this order from the substrate side. Among them, in the embodiments shown in FIGS. 17 through 21 and 23, the depth profile of the substance (C) in the layer region (G) is changed in the content $C_{(PN)}$ *so as to be reduced from the interface position* $t_Q$ with the second layer region (S) toward the substrate side.

Figure 23:
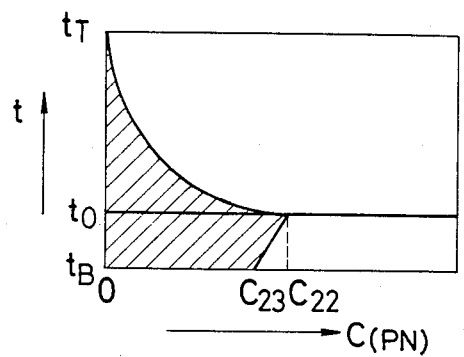
Figure 24:
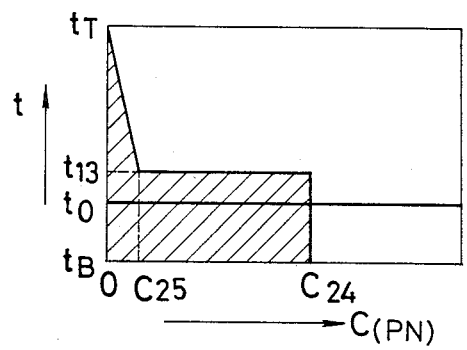

In the embodiments of FIGS. 23 and 24, the substance (C) is contained evenly in the layer thickness direction over the whole layer region of the light receiving layer.

In addition, in the case of FIG. 23, in the layer region (G), the content is increased linearly from $t_B$ to $t_0$ from the content $C_{23}$ at $t_B$ up to the content $C_{22}$ at $t_0$, while in the layer region (S), it is continuously reduced monotonously in a curve from the content $C_{22}$ at $t_0$ to the content 0 at $t_T$.

In the case of FIG. 24, the substance (C) is contained in the layer region between $t_B$ and $t_{13}$ at a constant content $C_{24}$, and the content is reduced linearly from $C_{25}$ at $t_{13}$ until it reaches 0 at $t_T$.

As described about typical examples of changes of the content $C_{(PN)}$ of the substance (C) for controlling conductivity in the light receiving layer in FIGS. 11 through 24, in either one of the embodiments, the substance (C) is contained in the light receiving layer so that the maximum content may exist within the second layer region (S) or at the interface with the first layer region (G).

In the present invention, for formation of the second layer region (S) constituted of a-Si(H,X), the starting materials (I) for formation of the first layer region (G), from which the starting material for the starting gas for supplying Ge is omitted, are used as the starting materials (II) for formation of the second alyer region (S), and layer formation can be effected following the same procedure and conditions as in formation of the first layer region (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer region (S) constituted of a-Si(H,X), the basic procedure comprises introducing a starting gas for Si supply capable of supplying silicon atoms as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising a-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer region (S) constituting the light receiving layer to be formed should preferably be 1 to 40 atomic %, more preferably 5 to 30 atomic, most preferably 5 to 25 atomic %.

For formation of the layer region (PN) containing the aforesaid substance (C) by incorporating a substance (C) for controlling conductivity such as the group III atoms or the group V atoms structurally into the light receiving layer, a starting material for introduction of the group III atoms or a starting material for introduction of the group V atoms may be introduced under gaseous state into a deposition chamber together with the starting materials for formation of the layer region during layer formation. As the starting material which can be used for introduction of the group III atoms, it is desirable to use those which are gaseous at room temperature under atmospheric pressure or can readily be gasified at least under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

The substrate to be used in the present invention may be either electroconductive material or insulating material. As the electroconductive material, there may be mentioned metals such as NiCr, stainless steel, Al, Cr, Mo, Au, Nb, Ta, V, Ti, Pt, Pd etc. or alloys thereof.

As the insulating material, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating substrates should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 100 in FIG. 1 is to be used as an image forming member for elecgrophotography, it may desirably be formed into an endless belt or a cylinder for use in continuous high speed copying. The substrate may have a thickness, which is conveniently determined so that a photoconductive member as desired may be formed. When the photoconductive member is required to have a flexibility, the substrate is made as thin as possible, so far as the function of a substrate can be sufficiently exhibited. However, in such a case, the thickness is preferably $10\mu$ or more from the points of fabrication and handling of the substrate as well as its mechanical strength.

Figure 25:
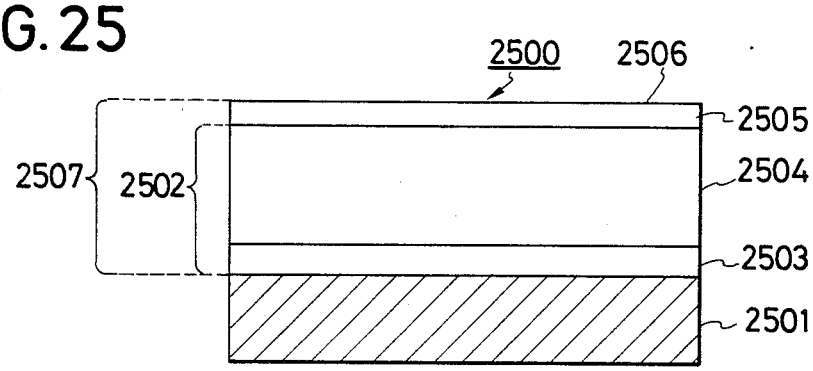

FIG. 25 shows a shematic illustration for explanation of the layer structure of the second embodiment of the photoconductive member of the present invention.

The photoconductive member 2500 shown in FIG. 25 has a light receiving layer 2507 consisting of a first layer (I) 2502 and a second layer (II) 2505 on a substrate 2501 for photoconductive member, said light receiving layer 2507 having a free surface 2506 on one end surface.

The photoconductive member 2500 shown in FIG. 25 is the same as the photoconductive member 100 shown in FIG. 1 except for having a second layer (II) 2505 on the first layer (I) 2502. That is, the first layer region (G) 2503 and the second layer region (S) 2504 constituting the first layer (I) 2502 correspond, respectively, to the first layer region (G) 103 and the second layer region (S) 104 shown in FIG. 1, and all the descriptions concerning the first layer region (G) and the second layer region (S) are applicable for the layer region 2503 and the layer region 2504, respectively. The situation is the same with respect to the substrate 2501.

The second layer (II) 2505 formed on the first layer (I) 2502 has a free surface and is provided for accomplishing the objects of the present invention primarily in humidity resistance, continuous repeated use characteristic, dielectric strength, use environment characteristic and durability.

The second layer (II) 2505 is constituted of an amorphous material containing silicon atoms (Si) and at least one of carbon atoms (C), nitrogen atoms (N) and oxygen atoms (O), optionally together with at least one of hydrogen atoms (H) and halogen atoms (X).

The above amorphous material constituting the second layer (II) may include an amorphous material containing silicon atoms (Si) and carbon atoms (C), optionally together with hydrogen atoms (H) and/or halogen atoms (X) (hereinafter written as "a-$(Si_xC_{1-x})_y(H,X)_{1-y}$", wherein $0<x, y<1$), an amorphous material containing silicon atoms (Si) and oxygen atoms (O), optionally together with hydrogen atoms (H) and/or halogen atoms (X) (hereinafter written as "a-$(Si_xO_{1-x})_y(H,X)_{1-y}$", wherein $0<x, y<1$), and an amophous material containing silicon atoms (Si) and nitrogen atoms (N), optionally together with hydrogen atoms (H) and/or halogen atoms (X) (hereinafter written as "a-$(Si_xN_{1-x})_y(H,X)_{1-y}$", wherein $0<x, y<1$).

In the present invention, the respective amorphous materials constituting the first layer (I) and the second layer (II) have the common constituent of silicon atom, and therefore chemical stability is sufficiently ensured at the laminated interface.

Formation of the second amorphous layer (II) may be performed according to the glow discharge method, the sputtering method, the ion-implantation method, the ion-plating method, the electron beam method, etc. These preparation methods may be suitably selected depending on various factors such as the preparation conditions, the extent of the load for capital investment for installations, the production scale, the desirable characteristics required for the photoconductive member to be prepared, etc. For the advantages of relatively easy control of the preparation conditions for preparing photoconductive members having desired characteristics and easy introduction of other atoms with silicon atoms (Si) into the second amorphous layer (II) to be prepared, there may preferably be employed the glow discharge method or the sputtering method.

Further, in the present invention, the glow discharge method and the sputtering method may be used in combination in the same device system to form the second layer (II).

For formation of the second layer (II) according to the glow discharge method, starting gases for formation of the second layer (II), which may optionally be mixed with a diluting gas at a predetermined mixing ratio, may be introduced into a deposition chamber for vacuum deposition in which a substrate is placed, and glow discharge is excited in said deposition chamber to form the gases introduced into a gas plasma, thereby depositing amorphous material for formation of the second layer (II) on the first layer (I) already formed on the substrate.

In the present invention, suitable halogen atoms (X) contained in the second layer 2505 are F, Cl, Br and I, particularly preferably F and Cl.

In the present invention, as starting gases for formation of a-$(Si_xC_{1-x})_y(H,X)_{1-y}$, there may be employed most of substances containing at least one of silicon atoms (Si), carbon atoms (C), hydrogen atoms (H) and halogen atoms (X) as constituent atoms which are gaseous or gasified substances of redily gasifiable ones.

For example, it is possible to use a mixture of a starting gas containing Si as constituent atom, a starting gas containing C as constituent atom and optionally a starting gas containing H as constituent atom and/or a starting gas containing X as constituent atom at a desired mixing ratio, or a mixture of a starting gas containing Si as constituent atom and a starting gas containing C and H as constituent atoms and/or a starting gas containing C and X as constituent atoms also at a desired ratio, or a mixture of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, as starting gases for formation of $a\text{-}(Si_xO_{1-x})_y(H,X)_{1-y}$, there may be employed most of substances containing at least one of silicon atoms (Si), oxygen atoms (O), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing O as constituent atom and optionally a starting gas containing H as constituent atom and/or a starting gas containing X as constituent atom at a desired mixing ratio, or a mixture of a starting gas containing Si as constituent atom and a starting gas containing O and H as constituent atoms and/or a starting gas containing O and X as constituent atoms also at a desired ratio, or a mixture of a starting gas containing Si as constituent atom and a starting gas containing three constituent atoms of Si, O and H or a starting gas containing three constituent atoms of Si, O and X.

Alternatively, it is also possible to use a mixture of a starting gas containing Si and H as constituent atoms with a starting gas containing O as constituent atom or a mixture of a starting gas containing Si and X as constituent atoms and a starting gas containing O as constituent atom.

In the present invention, as starting gases for formation of $a\text{-}(Si_xN_{1-x})_y(H,X)_{1-y}$, there may be employed most of substances containing at least one of silicon atoms (Si), nitrogen atoms (N), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing N as constituent atom and optionally a starting gas containing H as constituent atom and/or a starting gas containing X as constituent atom at a desired mixing ratio, or a mixture of a starting gas containing Si as constituent atom and a starting gas containing N and H as constituent atoms and/or a starting gas containing N and X as constituent atoms also at a desired ratio, or a mixture of a starting gas containing Si as constituent atom and a starting gas containing three constituent atoms of Si, N and H or a starting gas containing three constituent atoms of Si, N and X.

Alternatively, it is also possible to use a mixture of a starting gas containing Si and H as constituent atoms with a starting gas containing N as constituent atom or a mixture of a starting gas containing Si and X as constituent atoms and a starting gas containing N as constituent atom.

In the present invention, the starting gas which can be effectively used for formation of the second layer (II) may include those which are gaseous under conditions of room temperature and atmospheric pressure or can be readily gasified.

In the present invention, the starting gases effectively used for formation of the second amorphous layer (II) may include hydrogenated silicon containing Si and H as constituent atoms such as silanes (e.g. $SiH_4$, $Si_2H_6$, $Si_3H_8$, $Si_4H_{10}$, etc.), compounds containing C and H as constituent atoms such as saturated hydrocarbons having 1 to 4 carbon atoms, ethylenic hydrocarbons having 2 to 4 carbon atoms and acetylenic hydrocarbons having 2 to 3 carbon atoms, single substances of halogen, hydrogen halides, interhalogen compounds, silicon halide, halo-substituted hydrogenated silicon, etc.

More specifically, there may be included, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene $C_4H_8$), pentene ($C_5H_{10}$); as acetylenic hydrocarbons, acetylene ($C_2H_2$), methyl acetylene ($C_3H_4$), butyne ($C_4H_6$); as single substances of halogen, fluorine, chlorine, bromine or iodine; as hydrogen halides, HF, HI, HCl and HBr; as inerhalogen compounds, BrF, ClF, $ClF_3$, $ClF_5$, $BrF_5$, $BrF_3$, $IF_5$, $IF_7$, ICl, IBr; as silicon halodies, $SiF_4$, $Si_2F_6$, $SiCl_4$, $SiCl_3Br$, $SiCl_2Br_2$, $SiClBr_3$, $SiCl_3I$, $SiBr_4$; as halo-substituted hydrogenated silicon, $SiH_2F_2$, $SiH_2Cl_2$, $SiHCl_3$, $SiH_3Cl$, $SiH_3Br$, $SiH_2Br_2$, $SiHBr_3$, etc.; and so on.

Otherwise, it is also possible to use halo-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halo-containing alkyl silanes such as $SiCl(CH_3)_3$, $SiCl_2(CH_3)_2$, $SiCl_3CH_3$, etc. as effective ones.

The starting material effectively used as the starting gas for introduction of oxygen atoms (O) to be used during formation of the second layer (II), it is possible to use compounds containing O as constituent atom or compounds containing N and O as constituent atoms, such as oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide, and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

The starting material effectively used as the starting gas for introduction of nitrogen atoms (N) to be used during formation of the second layer (II), it is possible to use compounds containing N as constituent atom or compounds containing N and H as constituent atoms, such as gaseous or gasifiable nitrogen compounds, nitrides and azides, including for example, nitrogen ($N_2$), ammonia ($NH_3$), hydraxine ($H_2NNH_2$), hydrogen azide ($HN_3$), ammonium azide ($NH_4N_3$) and so on. Alternatively, for the advantage of introducing halogen atoms (X) in addition to nitrogen atoms (N), there may be also employed nitrogen halide compounds such as nitrogen trifluoride ($F_3N$), dinitrogen tetrafluoride ($F_4N_2$) and the like.

The starting materials for formation of the above second layer (II) may be selected and employed as desired in formation of the second layer (II) so that silicon atoms, and other atom selected from carbon atoms, oxygen atoms, nitrogen atoms, hydrogen atoms or halogen atoms may be contained at a predetermined composition ratio in the second layer (II) to be formed.

For example, $Si(CH_3)_4$ as the material capable of incorporating easily silicon atoms, carbon atoms, and hydrogen atoms and forming a layer having desired characteristics and $SiHCl_3$, $SiCl_4$, $SiH_2Cl_2$ or $SiH_3Cl$ as the material for incorporating halogen atoms may be mixed at a predetermined mixing ratio and introduced under gaseous state into a device for formation of a second layer (II), followed by excitation of glow discharge, whereby there can be formed a second layer (II) comprising a-$(Si_xC_{1-x})_y(Cl+H)_{1-y}$.

For formation of the second layer (II) according to the sputtering method, either one of a single crystalline or polycrystalline Si wafer, C wafer, $SiO_2$ wafer and $Si_3N_4$ wafer, or a wafer containing Si and at least one of C, $SiO_2$ and $Si_3N_4$ mixed therein is used as target and subjected to sputtering in an atmosphere of various gases containing optionally halogen atoms and/or hydrogen atoms as constituents.

For example, when Si wafer is used as target, starting gases for introducing at least one of C, O and N, together with a starting gas for introduction of H and/or X, which may be diluted with a diluting gas, if desired, are introduced into a deposition chamber for sputtering to form a gas plasma of these gases therein and effect sputtering of said Si wafer.

Alternatively, Si and one of C, $SiO_2$ and $Si_3N_4$ as separate targets or one sheet target of a mixture of Si and one of C, $SiO_2$ and $Si_3N_4$ can be used and sputtering is effected in a gas atmosphere containing optionally hydrogen atoms and/or halogen atoms. As the starting gases for introduction of C, O, N, H and X, there may be employed those as mentioned in the glow discharge as described above as effective gases also in case of sputtering.

In the present invention, as the diluting gas to be used in formation of the second layer (II) by the glow discharge method or the sputtering method, there may be included the so called rare gases such as He, Ne and Ar as preferable ones.

The second layer (II) in the present invention should be carefully formed so that the required characteristics may be given exactly as desired.

That is, the above material containing Si and at least one of C, N and O, optionally together with H and/or X as constituent atoms can take various forms from crystalline to amorphous and show electrical properties from conductive through semi-condictive to insulating and photoconductive properties from photoconductive to non-photoconductive depending on the preparation conditions. Therefore, in the present invention, the preparation conditions are strictly selected as desired so that there may be formed the amorphous material for constitution of the second layer (II) having desired characteristics depending on the purpose. For example, when the second layer (II) is to be provided primarily for the purpose of improvement of dielectric strength, the amorphous material for constituting the second layer is prepared as an amorphous material having marked electric insulating behaviours under the use environment.

Alternatively, when the primary purpose for provision of the second layer (II) is improvement of continuous repeated use characteristics or environmental use characteristics, the degree of the above electric insulating property may be alleviated to some extent and the aforesaid amorphous material may be prepared as an amorphous material having sensitivity to some extent to the light irradiated.

In forming the second layer (II) 105 on the surface of the first layer (I) 102, the substrate temperature during layer formation is an important factor having influences on the structure and the characteristics of the layer to be formed, and it is desired in the present invention to control severely the substrate temperature during layer formation so that the second layer (II) having intended characteristics may be prepared as desired.

As the substrate temperature in forming the second layer (II) for accomplishing effectively the objects in the present invention, there may be selected suitably the optimum temperature range in conformity with the method for forming the second layer (II) in carrying out formation of the second layer (II), preferably 20° to 400° C., more preferably 50° to 350° C., most preferably 100° to 300° C. For formation of the second layer (II), the glow discharge method or the sputtering method may be advantageously adopted, because severe control of the composition ratio of atoms constituting the layer or control of layer thickness can be conducted with relative ease as compared with other methods. In case when the second layer (II) is to be formed according to these layer forming methods, the discharging power during layer formation is one of important factors influencing the characteristics of the above amorphous material to be prepared, similarly as the aforesaid substrate temperature.

The discharging power condition for preparing effectively the amorphous material having characteristics for accomplishing the objects of the present invention with good productivity may preferably be 10 to 300 W, more preferably 20 to 250 W, most preferably 50 to 200 W.

The gas pressure in a deposition chamber may preferably be 0.01 to 1 Torr, more preferably 0.1 to 0.5 Torr.

In the present invention, the above numerical ranges may be mentioned as preferable numerical ranges for the substrate temperature, discharging power for preparation of the second layer (II). However, these factors for layer formation should not be determined separately independently of each other, but it is desirable that the optimum values of respective layer forming factors should be determined based on mutual organic relationships so that the second layer (II) having desired characteristics may be formed.

The respective contents of carbon atoms, oxygen atoms and nitrogen atoms in the second layer (II) in the photoconductive member of the present invention are important factors for obtaining the desired characteristics to accomplish the objects of the present invention, similarly as the conditions for preparation of the second layer (II). The respective contents of carbon atoms, oxygen atoms and nitrogen atoms contained in the second layer (II) in the present invention are determined as desired depending on the amorphous material constituting the second layer (II) and its characteristics.

More specifically, the amorphous material represented by the above formula a-$(Si_xC_{1-x})_y(H,X)_{1-y}$ may be broadly classified into an amorphous material constituted of silicon atoms and carbon atoms (hereinafter written as "a-$Si_aC_{1-a}$", where $0<a<1$), an amorphous material constituted of silicon atoms, carbon atoms and hydrogen atoms (hereinafter written as a-$(Si_bC_{1-b})_cH_{1-c}$, where $0<b$, $c<1$) and an amorphous material constituted of silicon atoms, carbon atoms, halogen atoms and optionally hydrogen atoms (hereinafter written as "a-$(Si_dC_{1-d})_e(H,X)_{1-e}$", where $0<d$, $e<1$).

In the present invention, when the second layer (II) is to be constituted of a-$Si_aC_{1-a}$, the content of carbon atoms in the second layer (II) may generally be $1\times10^{-3}$ to 90 atomic %, more preferably 1 to 80 atomic %, most preferably 10 to 75 atomic %, namely in terms of representation by a in the above a-$Si_aC_{1-a}$, a being preferably 0.1 to 0.99999, more preferably 0.2 to 0.99, most preferably 0.25 to 0.9.

In the present invention, when the second layer (II) is to be constituted of a-$(Si_bC_{1-b})_cH_{1-c}$, the content of carbon atoms in the second layer (II) may preferably be $1\times10^{-3}$ to 90 atomic %, more preferably 1 to 90 atomic %, most preferably 10 to 80 atomic %, the content of hydrogen atoms preferably 1 to 40 atomic %, more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bC_{1-b})_cH_{1-c}$, b should preferably be 0.1 to 0.99999, more preferably 0.1 to 0.99, most preferably 0.2 to 0.9, and c preferably 0.6 to 0.99, more preferably 0.65 to 0.98, most preferably 0.7 to 0.95.

When the second layer (II) to be constituted of a-$(Si_dC_{1-d})_e(H,X)_{1-e}$, the content of carbon atoms in the second layer (II) may preferably be $1\times10^{-3}$ to 90 atomic %, more preferably 1 to 90 atomic %, most preferably 10 to 85 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

That is in terms of representation by d and e in the above a-$(Si_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82 to 0.99, most preferably 0.85 to 0.98.

On the other hand, the amorphous material represented by the above formula a-$(Si_xO_{1-x})_y(H,X)_{1-y}$ may be broadly classified into an amorphous material constituted of silicon atoms and oxygen atoms (hereinafter written as "a-$Si_aO_{1-a}$", where $0<a<1$), an amorphous material constituted of silicon atoms, oxygen atoms and hydrogen atoms (hereinafter written as a-$(Si_bO_{1-b})_cH_{1-c}$, where $0<b$, $c<1$) and an amorphous material constituted of silicon atoms, oxygen atoms, halogen atoms and optionally hydrogen atoms (hereinafter written as "a-$(Si_dO_{1-d})_e(H,X)_{1-e}$", where $0<d$, $e<1$).

In the present invention, when the second layer (II) is to be constituted of a-$Si_aO_{1-a}$, the content of oxygen atoms in the second layer (II) may preferably be 0.33 to 0.99999, more preferably 0.5 to 0.99, most preferably 0.6 to 0.9, in terms of a in the above formula a-$Si_aO_{1-a}$.

In the present invention, when the second layer (II) is to be constituted of a-$(Si_bO_{1-b})_cH_{1-c}$, the content of oxygen atoms may preferably be such that b in the above formula a-$(Si_bO_{1-b})_cH_{1-c}$ may preferably be 0.33 to 0.99999, more preferably be 0.5 to 0.9, most preferably 0.6 to 0.9, and c preferably 0.6 to 0.99, more preferably 0.65 to 0.98, most preferably 0.7 to 0.95.

When the second layer (II) is to be constituted of a-$(Si_dO_{1-d})_e(H,X)_{1-e}$, the content of oxygen atoms may preferably be such that d in the above formula a-$(Si_dO_{1-d})_e(H,X)_{1-e}$ may preferably be 0.33 to 0.99999, more preferably be 0.5 to 0.99, most preferably 0.6 to 0.9, and e preferably 0.8 to 0.99, more preferably 0.82 to 0.99, most preferably 0.85 to 0.98.

Also, the amorphous material represented by the above formula a-$(Si_xN_{1-x})_y(H,X)_{1-y}$ may be broadly classified into an amorphous material constituted of silicon atoms and nitrogen atoms (hereinafter written as "a-$Si_aN_{1-a}$", where $0<a<1$), an amophous material constituted of silicon atoms, nitrogen atoms and hydrogen atoms (hereinafter written as a-$(Si_bN_{1-b})_cH_{1-c}$, where $0<b$, $c<1$) and an amorphous material constituted of silicon atoms, nitrogen atoms, halogen atoms and optionally hydrogen atoms (hereinafter written as "a-$(Si_dN_{1-d})_e(H,X)_{1-e}$", where $0<d$, $e<1$).

In the present invention, when the second layer (II) is to be constituted of a-$Si_aN_{1-a}$, the content of nitrogen atoms in the second layer (II) may generally be $1\times10^{-3}$ to 60 atomic %, more preferably 1 to 50 atomic %, most preferably 10 to 45 atomic %, namely in terms of representation by a in the above a-$Si_aN_{1-a}$, a being preferably 0.4 to 0.99999, more preferably 0.5 to 0.99, most preferably 0.55 to 0.9.

In the present invention, when the second layer (II) is to be constituted of a-$(Si_bN_{1-b})_cH_{1-c}$, the content of nitrogen atoms may preferably be $1\times10^{-3}$ to 55 atomic %, more preferably 1 to 55 atomic %, most preferably 10 to 55 atomic %, the content of hydrogen atoms preferably 1 to 40 atomic %, more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bN_{1-b})_cH_{1-c}$, b should preferably be 0.45 to 0.99999, more preferably 0.45 to 0.99, most preferably 0.45 to 0.9, and c preferably 0.6 to 0.99, more preferably 0.65 to 0.98, most preferably 0.7 to 0.95.

When the second layer (II) is to be constituted of a-$(Si_dN_{1-d})_e(H,X)_{1-e}$, the content of nitrogen atoms may preferably be $1\times10^{-3}$ to 60 atomic %, more preferably 1 to 60 atomic %, most preferably 10 to 55 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

That is, in terms of representation by d and e in the above a-$(Si_dN_{1-d})_e(H,X)_{1-e}$, d should preferably be 0.4 to 0.99999, more preferably 0.4 to 0.99, most preferably 0.45 to 0.9, and e preferably 0.8 to 0.99, more preferably 0.82 to 0.99, most preferably 0.85 to 0.98.

The range of the numerical value of layer thickness of the second layer (II) should desirably be determined depending on the intended purpose so as to effectively accomplish the objects of the present invention.

The layer thickness of the second layer (II) is also required to be determined as desired suitably with due considerations about the relationships with the contents of carbon atoms, oxygen atoms or nitrogen atoms, the relationship with the layer thickness of the first layer (I), as well as other organic relationships with the characteristics required for respective layer regions.

In addition, it is also desirable to have considerations from economical point of view such as productivity or capability of bulk production.

The second layer (II) in the present invention is desired to have a layer thickness preferably of 0.003 to 30μ, more preferably 0.004 to 20μ, most preferably 0.005 to 10μ.

Next, an example of the process for producing the photoconductive member of this invention is to be briefly described.

Figure 26:
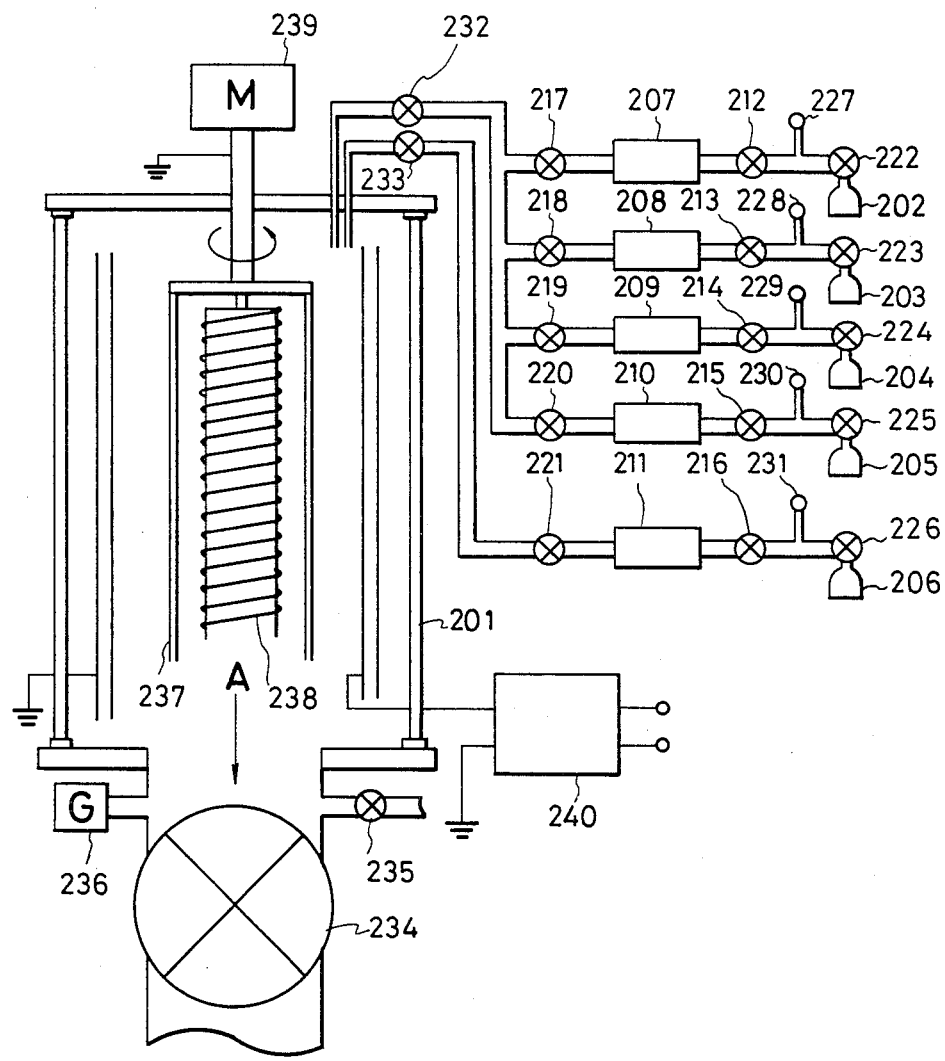
FIG. 26 is a schematic illustration of the device used in the present invention.

FIG. 26 shows one example of a device for producing a photoconductive member.

In the gas bombs 202 to 206, there are hermetically contained starting gases for formation of the photosensitive member of the present invention. For example, 202 is a bomb containing $SiH_4$ gas diluted with He (purity: 99.999%, hereinafter abbreviated as $SiH_4$/He), 203 is a bomb containing $GeH_4$ gas diluted with He (purity: 99.999%, hereinafter abbreviated as $GeH_4$/He), 204 is a bomb containing $SiF_4$ gas diluted with He (purity: 99.999%, hereinafter abbreviated as $SiF_4$/He), 205 is a bomb containing $B_2H_6$ gas diluted with He (purity: 99.999%, hereinafter abbreviated as $B_2H_6$/He) and 206 is a bomb containing $H_2$ gas (purity: 99.999%).

For allowing these gases to flow into the reaction chamber 201, on confirmation of the valves 222–226 of the gas bombs 202–206, and the leak valve 235 to be closed, and the inflow valves, 212–216, the outflow valves 217–221 and the auxiliary valves 232, 233 to be opened, the main valve 234 is first opened to evacuate the reaction chamber 201 and the gas pipelines. As the next step, when the reading on the vacuum indicator 236 becomes $5 \times 10^{-6}$ Torr, the auxiliary valves 232, 233 and the outflow valves 217–221 are closed.

Referring now to an example of forming a light receiving layer on the cylindrical substrate 237, $SiH_4$/He gas from the gas bomb 202, $GeH_4$/He gas from the gas bomb 203 are permitted to flow into the mass-flow controllers 207, 208, respectively, by opening the valves 222, 223 and controlling the pressures at the outlet pressure gauges 227, 228 to 1 Kg/cm² and opening gradually the inflow valves 212, 213, respectively. Subsequently, the outflow valves 217, 218 and the auxiliary valve 232 are gradually opened to permit respective gases to flow into the reaction chamber 201. The outflow valves 217, 218 are controlled so that the flow rate ratio of $SiH_4$/He and $GeH_4$/He may have a desired value and opening of the main valve 234 is also controlled while watching the reading on the vacuum indicator 236 so that the pressure in the reaction chamber may reach a desired value. And, after confirming that the temperature of the substrate 237 is set at 50°–400° C. by the heater 238, the power source 240 is set at a desired power to excite glow discharge in the reaction chamber 201, thereby forming a first layer region (G) 103 on the substrate 237. When the first layer region (G) 103 is formed to a desired thickness, following the same conditions and the procedure except for completely closing the outflow valve 218, leading $B_2H_6$/He gas from the gas bomb 205 according to the same valve operation as in the case of the above $SiH_4$/He gas into the reaction chamber 201, controlling the mass flow controller 210 according to a desired doping curve, and changing the discharging conditions, if desired, glow discharging is maintained for a desired period of time, whereby the second layer region (s) 104 containing substantially no germanium atom can be formed on the first layer region (G) 103.

Thus, a first layer (I) 102 constituted of the first layer region (G) 103 and the second layer region (S) 104 is formed on the substrate 237.

Formation of a second layer (II) 105 on the first layer (I) 102 may be performed by use of, for example, $SiH_4$ gas and at least one gas of $C_2H_4$, NO and $NH_3$ gases, optionally diluted with a diluting gas such as He, according to same valve operation as in formation of the first layer (I) 102, and exciting glow discharge following the desirable conditions.

For incorporation of halogen atoms in the second layer (II) 105, for example, $SiF_4$ gas and either one of $C_2H_4$, NO and $NH_3$ gases, or a gas mixture further added with $SiH_4$ gas, may be used to form the second layer (II) according to the same procedure as described above.

During formation of the respective layers, outflow valves other than those for necessary gases should of course be closed. Also, during formation of respective layers, in order to avoid remaining of the gas employed for formation of the preceding layer in the reaction chamber 201 and the gas pipelines from the outflow valves 217–221 to the reaction chamber 201, the operation of evacuating the system to high vacuum by closing the outflow valves 217–221, opening the auxiliary valves 232, 233 and opening fully the main valve 234 is conducted, if necessary.

Each amount of carbon atoms, oxygen atoms and nitrogen atoms contained in the second layer (II) 105 can be controlled as desired by, for example, in the case of glow discharge, changing the flow rate ratio of $SiH_4$ gas and the gas such as $C_2H_4$, NO or $NH_3$ to be introduced into the reaction chamber 201 as desired, or in the case of layer formation by sputtering, changing the sputtering area ratio of silicon wafer to a wafer selected from among graphite wafer, $SiO_2$ wafer and $Si_3N_4$ wafer, or molding a target with the use of a mixture of silicon powder with the powder selected from among graphite powder, $SiO_2$ powder and $Si_3N_4$ powder. The content of halogen atoms (X) contained in the second layer (II) can be controlled by controlling the flow rate of the starting gas for introduction of halogen atoms such as $SiF_4$ gas when introduced into the reaction chamber 201.

Also, for uniformization of the layer formation, it is desirable to rotate the substrate 237 by means of a motor 239 at a constant speed during layer formation.

The present invention is described in more detail by referring to the following Examples.

EXAMPLE 1

By means of the device shown in FIG. 26, respective samples of image forming members for electrophotography (see Table 2A) were prepared, respectively, on cylindrical aluminum substrates under the conditions shown in Table 1A.

Figure 27:
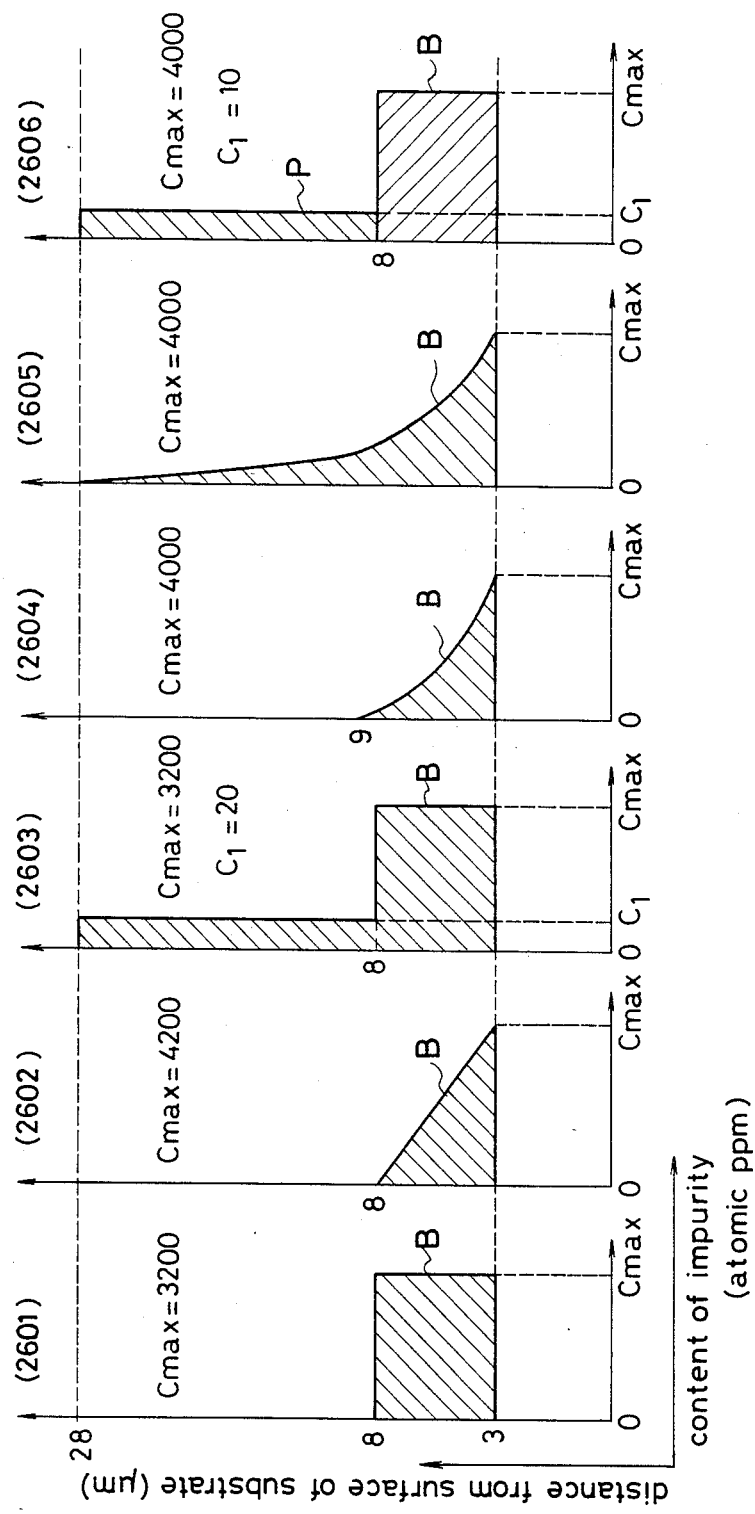
FIGS. 27 through 29 each shows a schematic illustrations of the depth profiles of the respective atoms in Examples of the present invention.

During formation of the layer region (S), by varying the flow rate ratio of $B_2H_6$ gas and $PH_3$ gas according to the change rate curves previously designed, respectively, the depth profiles as shown in FIG. 27 were formed for respective samples.

TABLE 2A

| Sample No. | Depth profile of impurity atoms |
| --- | --- |
| 1-1A | 2601 |
| 1-2A | 2602 |
| 1-3A | 2603 |
| 1-4A | 2604 |
| 1-5A | 2605 |
| 1-6A | 2606 |

Each of the samples thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image on the light receiving layer was transferred onto a transfer paper by corona charging of ⊕5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 2

By means of the device shown in FIG. 26, respective samples of image forming members for electrophotography (see Table 4A) were prepared, respectively, on cylindrical aluminum substrates under the conditions shown in Table 3A.

Figure 28:
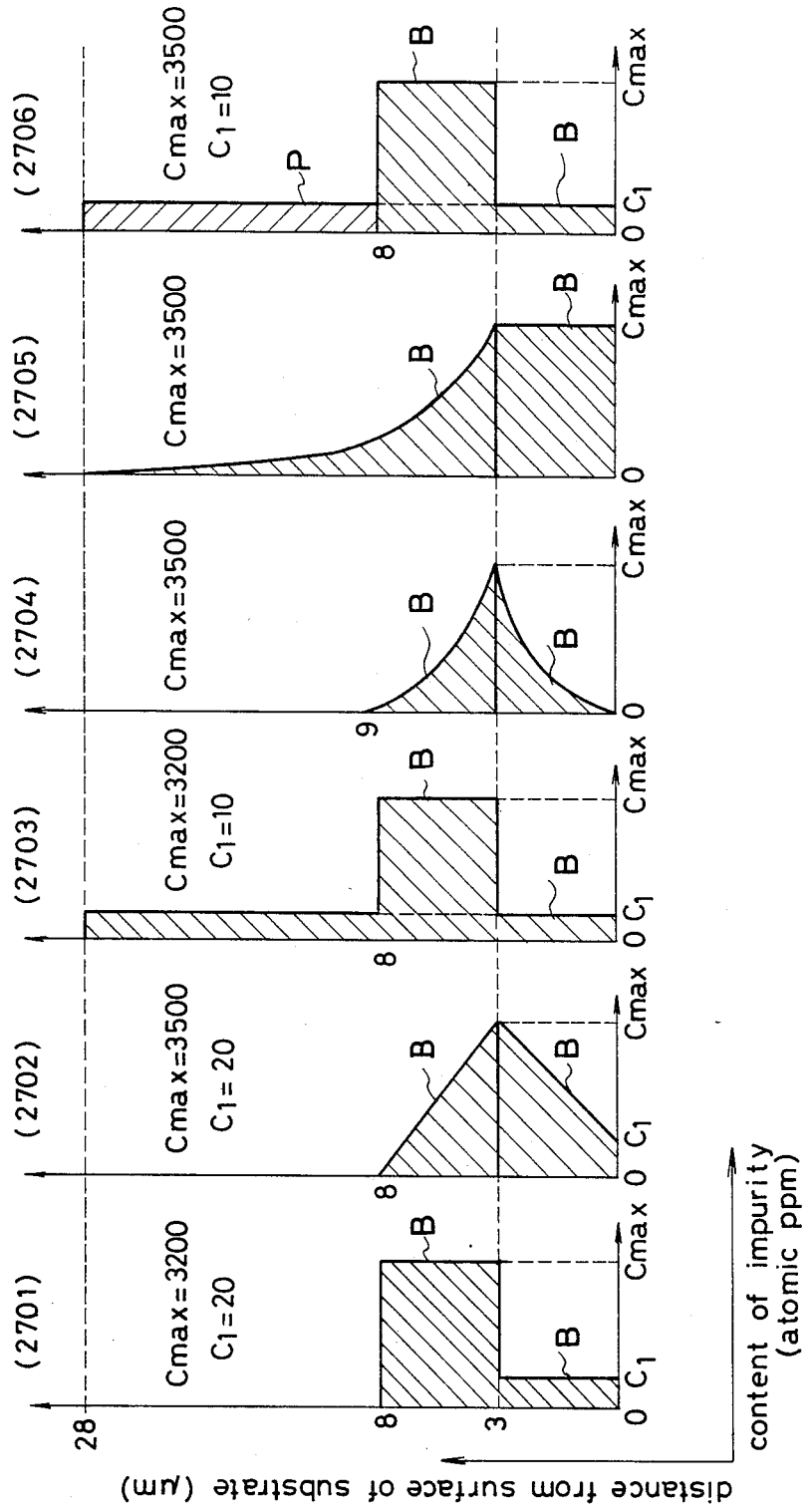

During formation of the layer region (G) and the layer region (S), by varying the flow rate ratio of $B_2H_6$ gas and $PH_3$ gas according to the change rate curves previously designed, respectively, the depth profiles as shown in FIG. 28 were formed for respective samples.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

TABLE 4A

| Sample No. | Depth profile of impurity atoms |
| --- | --- |
| 2-1A | 2701 |
| 2-2A | 2702 |
| 2-3A | 2703 |
| 2-4A | 2704 |
| 2-5A | 2705 |
| 2-6A | 2706 |

EXAMPLE 3

By means of the device shown in FIG. 26, respective samples of image forming members for electrophotography (Samples No. 31-1A to No. 37-12A; see Table 6A) were prepared, respectively, on cylindrical aluminum substrates under the conditions shown in Table 5A.

Figure 29:
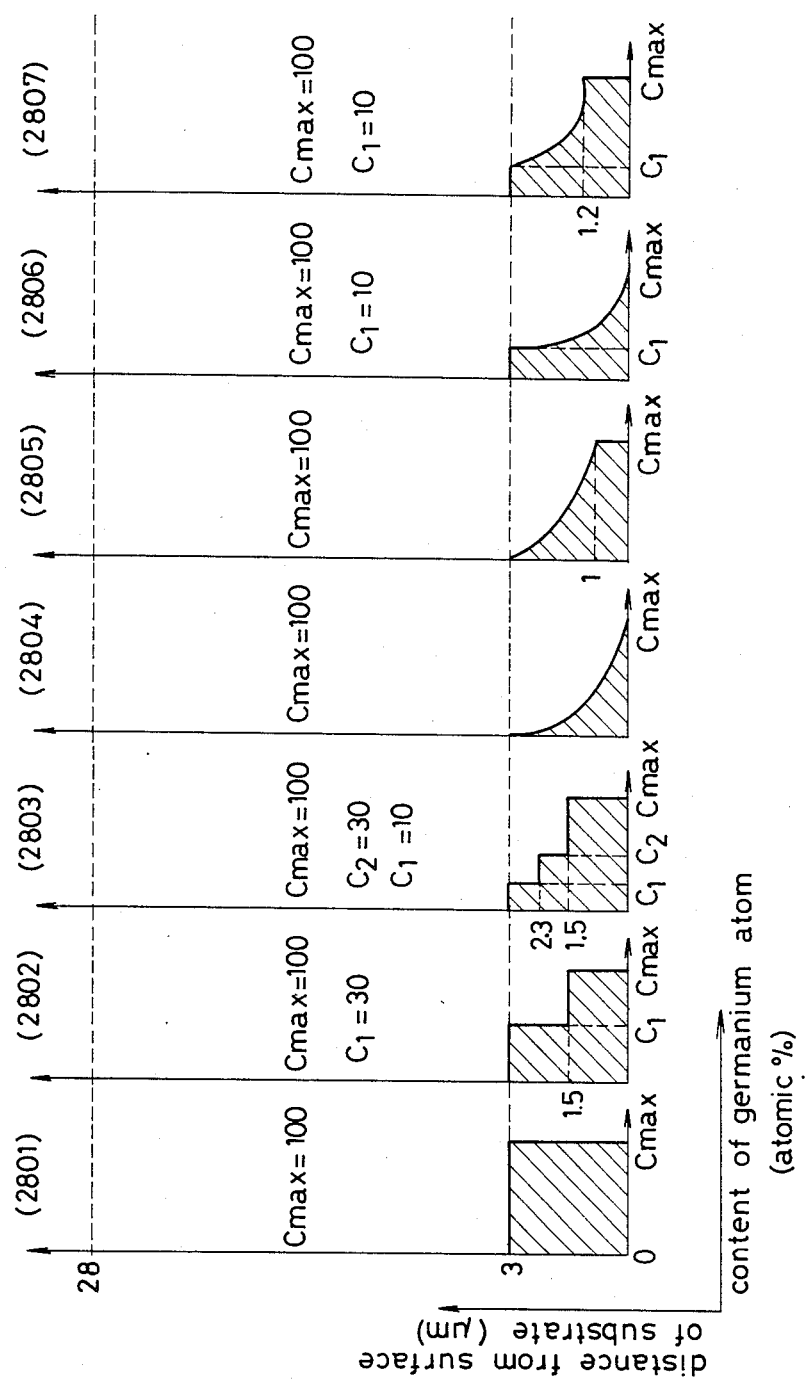

The depth profiles of germanium atoms in respective samples are shown in FIG. 29 and the depth profiles of impurity atoms in FIG. 27 and FIG. 28.

For each of these samples, the same image evaluation test was conducted as in Example 1 to give a toner transferred image of high quality in each sample. Also, for each sample, usage test repeated for 200,000 times was performed under the environment of 38° C. and 80 % RH. As the result, no lowering in image quality was observed in each sample.

EXAMPLE 4

By means of the device shown in FIG. 26, respective samples of image forming members for electrophotography (see Table 2B) were prepared, respectively, on cylindrical aluminum substrates under the conditions shown in Table 1B.

During formation of the second layer region (S), by varying the flow rate ratio of $B_2H_6$ gas and $PH_3$ gas according to the change rate curves previously designed, respectively, the depth profiles as shown in FIG. 27 were formed for respective samples.

TABLE 2B

| Sample No. | Depth profile of impurity atoms |
| --- | --- |
| 1-1B | 2601 |
| 1-2B | 2602 |
| 1-3B | 2603 |
| 1-4B | 2604 |
| 1-5B | 2605 |
| 1-6B | 2606 |

Each of the samples thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image was transferred onto a transfer paper by corona charging of ⊕5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 5

By means of the device shown in FIG. 26, respective samples of image forming members for electrophotography (see Table 4B) were prepared, respectively, on cylindrical aluminum substrates under the conditions shown in Table 3B.

During formation of the first layer region (G) and the second layer region (S), by varying the flow rate ratio of $B_2H_6$ gas and $PH_3$ gas according to the change rate curves previously designed, respectively, the depth profiles as shown in FIG. 28 were formed for respective samples.

For each of these samples, the same image evaluation test was conducted as in Example 4 to give a toner transferred image of high quality in each sample. Also, for each sample, usage test repeated for 200,000 times was performed under the environment of 38° C. and 80% RH. As the result, no lowering in image quality was observed in each sample.

TABLE 4B

| Sample No. | Depth profile of impurity atoms |
| --- | --- |
| 2-1B | 2701 |
| 2-2B | 2702 |
| 2-3B | 2703 |
| 2-4B | 2704 |
| 2-5B | 2705 |
| 2-6B | 2706 |

EXAMPLE 6

By means of the device shown in FIG. 26, respective samples of image forming members for electrophotography (Samples No. 31-1B to No. 37-12B; see Table 6B) were prepared, respectively, on cylindrical aluminum substrates under the conditions shown in Table 5B.

The depth profiles of germanium atoms in respective samples are shown in FIG. 29 and the depth profiles of impurity atoms in FIG. 27 and FIG. 28.

For each of these samples, the same image evaluation test was conducted as in Example 4 to give a toner transferred image of high quality in each sample. Also, for each sample, usage test repeated for 200,000 times was performed under the environment of 38° C. and 80% RH. As the result, no lowering in image quality was observed in each sample.

EXAMPLE 7

Following the same conditions and the procedure as in Samples Nos. 1 - 1B, 1 - 2B and 1 - 3B in Example 4, except for changing the conditions for preparation of the second layer (II) 105 to the respective conditions as shown in 7B, image forming members for electrophotography shown in Table 8B were prepared, respectively (24 Samples of Sample No. 1-1-1B to 1-1-8B, 2-1-1B to 2-1-8B, 3-1-1B to 3-1-8B).

The respective image forming members for electrophotography thus prepared were individually set on a copying device, and for the respective image forming members for electrophotography corresponding to respective examples, under the same conditions as described in respective examples, overall image quality evaluation of the transferred image and evaluation of durability by repeated continuous uses were performed.

The results of the overall image quality evaluation and evaluation of durability by repeated continuous use for respective samples are shown in Table 8B.

EXAMPLE 8

Various image forming members were prepared according to the same method as in Sample No. 2 - 1B in Example 5, respectively, except for varying the content ratio of silicon atoms to carbon atoms in the second layer (II) by varying the target area ratio of silicon wafer to graphite wafer during formation of the second layer (II). For each of the image forming members thus obtained, the steps of image formation, developing and cleaning as described in Example 4 were repeated for about 50,000 times, and thereafter image evaluations were conducted to obtain the results as shown in Table 9B.

EXAMPLE 9

Various image forming members were prepared according to the same method as in Sample No. 2 - 1B in Example 5, respectively, except for varying the content ratio of silicon atoms to carbon atoms in the second layer (II) by varying the flow rate ratio of $SiH_4$ gas to $C_2H_4$ gas during formation of the second layer (II). For each of the image forming members thus obtained, the steps up to transfer were repeated for about 50,000 times according to the methods as described in Example 4, and thereafter image evaluations were conducted to obtain the results as shown in Table 10B.

EXAMPLE 10

Various image forming members were prepared according to the same method as in Sample No. 31 - 1B in Example 6, respectively, except for varying the content ratio of silicon atoms to carbon atoms in the second layer (II) by varying the flow rate ratio of $SiH_4$ gas, $SiF_4$ gas and $C_2H_4$ gas during formation of the second layer (II). For each of the image forming members thus obtained, the steps of image formation, developing and cleaning as described in Example 4 were repeated for about 50,000 times, and thereafter image evaluations were conducted to obtain the results as shown in Table 11B.

EXAMPLE 11

Respective image forming members were prepared in the same manner as in Sample No. 31 - 1B in Example 6, except for changing the layer thickness of the second layer (II), and the steps of image formation, developing and cleaning as described in Example 4 were repeated to obtain the results as shown in Table 12B.

EXAMPLE 12

By means of the device shown in FIG. 26, respective samples of image forming members for electrophotography (see Table 2C) were prepared, respectively, on cylindrical aluminum substrates under the conditions shown in Table 1C.

During formation of the second layer region (S) by varying the flow rate ratio of $B_2H_6$ gas and $PH_3$ gas according to the change rate curves previously designed, respectively, the depth profiles as shown in FIG. 27 were formed for respective samples.

TABLE 2C

| Sample No. | Depth profile of impurity atoms |
| --- | --- |
| 1-1C | 2601 |
| 1-2C | 2602 |
| 1-3C | 2603 |
| 1-4C | 2604 |
| 1-5C | 2605 |
| 1-6C | 2606 |

Each of the samples thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image on the light receiving layer was transferred onto a transfer paper by corona charging of ⊕5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 13

By means of the device shown in FIG. 26, respective samples of image forming members for electrophotography (see Table 4C) were prepared, respectively, on cylindrical aluminum substrates under the conditions shown in Table 3C.

During formation of the first layer region (G) and the second layer region (S), by varying the flow rate ratio of $B_2H_6$ gas and $PH_3$ gas according to the change rate curves previously designed, respectively, the depth profiles as shown in FIG. 28 were formed for respective samples.

For each of these samples, the same image evaluation test was conducted as in Example 12 to give a toner transferred image of high quality in each sample. Also, for each sample, usage test repeated for 200,000 times was performed under the environment of 38° C. and 80% RH. As the result, no lowering in image quality was observed in each sample.

TABLE 4C

| Sample No. | Depth profile of impurity atoms |
| --- | --- |
| 2-1C | 2701 |
| 2-2C | 2702 |
| 2-3C | 2703 |
| 2-4C | 2704 |
| 2-5C | 2705 |
| 2-6C | 2706 |

EXAMPLE 14

By means of the device shown in FIG. 26, respective samples of image forming members for electrophotography (Samples No. 31-1C to No. 37-12C; see Table 6C) were prepared, respectively, on cylindrical aluminum substrates under the conditions shown in Table 5C.

The depth profiles of germanium atoms in respective samples are shown in FIG. 29 and the depth profiles of impurity atoms in FIG. 27 and FIG. 28.

For each of these samples, the same image evaluation test as in Example 12 was conducted to give a toner transferred image of high quality in each sample. Also, for each sample, usage test repeated for 200,000 times was performed under the environment of 38° C. and 80% RH. As the result, no lowering in image quality was observed in each sample.

EXAMPLE 15

Following the same conditions and the procedure as in Samples Nos. 1 - 1C, 1 - 2C and 1 - 3C in Example 12, except for changing the conditions for preparation of the second layer (II) to the respective conditions as shown in Table 7C, image forming members for electrophotography were prepared, respectively (24 Samples of Sample No. 1-1-1C to 1-1-8C, 1-2-1C to 1-2-8C, 1-3-1C to 1-3-8C).

The respective image forming members for electrophotography thus prepared were individually set on a copying device, and corona charging was effected at ⊖5 KV for 0.2 sec, followed by irradiation of a light image. As the light source, a tungsten lamp was employed at a dosage of 1.0 lux. sec. The latent image was developed with a positively chargeable developer (containing toner and carrier) and transfrered onto a plain paper. The transferred image was very good. The toner remaining on the image forming member for electrophotography without being transferred was cleaned with a rubber blade. When such a step were repeated for 100,000 times or more, no deterioration of image was observed in every case.

The results of the overall image quality evaluation and evaluation of durability by repeated continuous use for respective samples are shown in Table 8C.

EXAMPLE 16

Various image forming members were prepared according to the same method as in Sample No. 1 - 1C in Example 12, respectively, except for varying the content ratio of silicon atoms to oxygen atoms in the second layer (II) by varying the ratio of Ar to NO in the gas mixture and the target area ratio of silicon wafer to $SiO_2$ during formation of the second layer (II). For each of the image forming members thus obtained, the steps of image formation, developing and cleaning as described in Example 12 were repeated for about 50,000 times, and thereafter image evaluations were conducted to obtain the results as shown in Table 9C.

EXAMPLE 17

Various image forming members were prepared according to the same method as in Sample No. 1 - 2C in Example 12, respectively, except for varying the content ratio of silicon atoms to oxygen atoms in the second layer (II) by varying the flow rate ratio of $SiH_4$ gas to NO gas during formation of the second layer (II). For each of the image forming members thus obtained, the steps up to transfer were repeated for about 50,000 times according to the methods as described in Example 12, and thereafter image evaluations were conducted to obtain the results as shown in Table 10C.

EXAMPLE 18

Various image forming members were prepared according to the same method as in Example 12, respectively, except for varying the content ratio of silicon atoms to oxygen atoms in the second layer (II) by varying the flow rate ratio of $SiH_4$ gas, $SiF_4$ gas and NO gas during formation of the second layer (II). For each of the image forming members thus obtained, the steps of image formation, developing and cleaning as described in Sample No. 1 - 3C in Example 12 were repeated for about 50,000 times, and thereafter image evaluations were conducted to obtain the results as shown in Table 11C.

EXAMPLE 19

Respective image forming members were prepared in the same manner as in Sample No. 1 - 4C in Example 12, except for changing the layer thickness of the second layer (II), and the steps of image formation, developing and cleaning as described in Example 12 were repeated to obtain the results as shown in Table 12C.

EXAMPLE 20

By means of the device shown in FIG. 26, respective samples of image forming members for electrophotography (see Table 2D) were prepared, respectively, on cylindrical aluminum substrates under the conditions shown in Table 1D.

During formation of the layer region (S), by varying the flow rate ratio of $B_2H_6$ gas and $PH_3$ gas according to the change rate curves previously designed, respectively, the depth profiles as shown in FIG. 27 were formed for respective samples.

TABLE 2D

| Sample No. | Depth profile of impurity atoms |
|---|---|
| 1-1D | 2601 |
| 1-2D | 2602 |
| 1-3D | 2603 |
| 1-4D | 2604 |
| 1-5D | 2605 |
| 1-6D | 2606 |

Each of the samples thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image was transferred onto a transfer paper by corona charging of ⊕5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 21

By means of the device shown in FIG. 26, respective samples of image forming members for electrophotography (see Table 4D) were prepared, respectively, on cylindrical aluminum substrates under the conditions shown in Table 3D.

During formation of the layer region (G) and the layer region (S), by varying the flow rate ratio of $B_2H_6$ gas and PH gas according to the change rate curves previously designed, respectively, the depth profiles as shown in FIG. 28 were formed for respective samples.

For each of these samples, the same image evaluation test as in Example 20 was conducted to give a toner transferred image of high quality in each sample. Also, for each sample, usage test repeated for 200,000 times was performed under the environment of 38° C. and 80% RH. As the result, no lowering in image quality was observed in each sample.

TABLE 4D

| Sample No. | Depth profile of impurity atoms |
|---|---|
| 2-1D | 2701 |
| 2-2D | 2702 |
| 2-3D | 2703 |
| 2-4D | 2704 |
| 2-5D | 2705 |
| 2-6D | 2706 |

EXAMPLE 22

By means of the device shown in FIG. 26, respective samples of image forming members for electrophotography (Samples No. 31-1D to No. 37-12D; see Table 6D) were prepared, respectively, on cylindrical aluminum substrates under the conditions shown in Table 5D.

The depth profiles of germanium atoms in respective samples are shown in FIG. 29 and the depth profiles of impurity atoms in FIG. 27 and FIG. 28.

For each of these samples, the same image evaluation test was conducted as in Example 20 to give a toner transferred image of high quality in each sample. Also, for each sample, usage test repeated for 200,000 times was performed under the environment of 38° C. and 80% RH. As the result, no lowering in image quality was observed in each sample.

EXAMPLE 23

Following the same conditions and the procedure as in Samples Nos. 1 - 1D, 1 - 2D and 1 - 3D in Example 20, except for changing the conditions for preparation of the second layer (II) to the respective conditions as shown in Table 7D, image forming members for electrophotography were prepared, respectively (24 Samples of Sample No. 1-1-1D to 1-1-8D, 1-2-1D to 1-2-8D, 1-3-1D to 1-3-8D).

The respective image forming members for electrophotography thus prepared were individually set on a copying device, and corona charging was effected at ⊖5 KV for 0.2 se, followed by irradiation of a light image. As the light source, a tungsten lamp was employed at a dosage of 1.0 lux.sec. The latent image was developed with a positively chargeable developer (containing toner and carrier) and transferred onto a plain paper. The transferred image was very good. The toner remaining on the image forming member for electrography without being transferred was cleaned with a rubber blade. When such a step were repeated for 100,000 times or more, no deterioration of image was observed in every case.

The results of the overall image quality evaluation and evaluation of durability by repeated continuous use for respective samples are shown in Table 8D.

EXAMPLE 24

Various image forming members were prepared according to the same method as in Sample No. 1 - 1D in Example 20, respectively, except for varying the content ratio of silicon atoms to nitrogen atoms in the second layer (II) by varying the ratio of Ar to $NH_3$ in the gas mixture and the target area ratio of silicon wafer to silicon nitride during formation of the second layer (II). For each of the image forming members thus obtained, the steps of image formation, developing and cleaning as described in Example 20 were repeated for about 50,000 times, and thereafter image evaluations were conducted to obtain the results as shown in Table 9D.

EXAMPLE 25

Various image forming members were prepared according to the same method as in Sample No. 1 - 2D in Example 12, respectively, except for varying the content ratio of silicon atoms to nitrogen atoms in the second layer (II) by varying the flow rate ratio of SiH₄ gas to NH₃ gas during formation of the second layer (II). For each of the image forming members thus obtained, the steps up to transfer were repeated for about 50,000 times according to the methods as described in Example 20, and thereafter image evaluations were conducted to obtain the results as shown in Table 10D.

EXAMPLE 26

Various image forming members were prepared according to the same method as in Sample No. 1 - 3D in Example 20, respectively, except for varying the content ratio of silicon atoms to nitrogen atoms in the second layer (II) by varying the flow rate ratio of SiH₄ gas, SiF₄ gas and NH₃ gas during formation of the second layer (II). For each of the image forming members thus obtained, the steps of image formation, developing and cleaning as described in Example 20 were repeated for about 50,000 times, and thereafter image evaluations were conducted to obtain the results as shown in Table 11D.

EXAMPLE 27

Respective image forming members were prepared in the same manner as in Sample No. 1 - 4D in Example 20, except for changing the layer thickness of the second layer (II), and the steps of image formation, developing and cleaning as described in Example 20 were repeated to obtain the results as shown in Table 12D.

The common layer forming conditions in the respective Examples of the present invention are shown below:

Substrate temperature:
    Germanium atom (Ge) containing layer . . . about 200° C.
    No germanium atom (Ge) containing layer . . . about 250° C.

Discharging frequency: 13.56 MHz

Inner pressure in reaction chamber during the reaction: 0.3 Torr.

TABLE 1A

| Layer constitution | Gases employed | Flow rate (SCCM) | Flow rate ratio | Discharging power (W/cm²) | Layer formation speed (Å/sec) | Layer thickness (μ) |
|---|---|---|---|---|---|---|
| Layer region (G) | GeF₄/He = 0.5<br>SiF₄/He = 0.5<br>H₂ | GeF₄ + SiF₄ = 200 | $\frac{(GeF_4 + SiF_4)}{(GeF_4 + SiF_4 + H_2)} = 7/10$<br><br>$\frac{GeF_4}{(GeF_4 + SiF_4 + H_2)} = 1/100$ | 0.18 | 15 | 3 |
| Layer region (S) | SiH₄/He = 0.5<br>B₂H₆/He = 1 × 10⁻³<br>*¹(PH₃/He = 1 × 10⁻³) | SiH₄ = 200 | | 0.18 | 15 | 25 |

*¹The parentheses represent "using PH₃/He in the place of B₂H₆/He". The parentheses in the subsequent other tables have the same meaning as given hereinbefore.

TABLE 3A

| Layer constitution | Gases employed | Flow rate (SCCM) | Flow rate ratio | Discharging power (W/cm²) | Layer formation speed (Å/sec) | Layer thickness (μ) |
|---|---|---|---|---|---|---|
| Layer region (G) | GeF₄/He = 0.5<br>SiF₄/He = 0.5<br>H₂<br>B₂H₆/He = 1 × 10⁻³ | GeF₄ + SiF₄ = 200 | $\frac{(GeF_4 + SiF_4)}{(GeF_4 + SiF_4 + H_2)} = 7/10$<br><br>$\frac{GeF_4}{(GeF_4 + SiF_4 + H_2)} = 1/100$ | 0.18 | 15 | 3 |
| Layer region (S) | SiH₄/He = 0.5<br>B₂H₆/He = 1 × 10⁻³<br>(PH₃/He = 1 × 10⁻³) | SiH₄ = 200 | | 0.18 | 15 | 25 |

TABLE 5A

| Layer constitution | Gases employed | Flow rate (SCCM) | Flow rate ratio | Discharging power (W/cm²) | Layer formation speed (Å/sec) | Layer thickness (μ) |
|---|---|---|---|---|---|---|
| Layer region (G) | GeH₄/He = 0.5<br>SiH₄/He = 0.5<br>(B₂H₆/He = 1 × 10⁻³)<br>H₂ | SiH₄ + GeH₄ = 200 | | 0.18 | 15 | 3 |
| Layer region (S) | SiH₄/He = 0.5<br>B₂H₆/He = 1 × 10⁻³<br>(PH₃/He = 1 × 10⁻³) | SiH₄ = 200 | | 0.18 | 15 | 25 |

TABLE 6A

| Depth profile of impurity atoms | Depth profile of Ge | | | | | | |
|---|---|---|---|---|---|---|---|
| | 2801 | 2802 | 2803 | 2804 | 2805 | 2806 | 2807 |
| | Sample No. | | | | | | |
| 2601 | 31-1A | 32-1A | 33-1A | 34-1A | 35-1A | 36-1A | 37-1A |
| 2602 | 31-2A | 32-2A | 33-2A | 34-2A | 35-2A | 36-2A | 37-2A |
| 2603 | 31-3A | 32-3A | 33-3A | 34-3A | 35-3A | 36-3A | 37-3A |
| 2604 | 31-4A | 32-4A | 33-4A | 34-4A | 35-4A | 36-4A | 37-4A |
| 2605 | 31-5A | 32-5A | 33-5A | 34-5A | 35-5A | 36-5A | 37-5A |
| 2606 | 31-6A | 32-6A | 33-6A | 34-6A | 35-6A | 36-6A | 37-6A |
| 2701 | 31-7A | 32-7A | 33-7A | 34-7A | 35-7A | 36-7A | 37-7A |
| 2702 | 31-8A | 32-8A | 33-8A | 34-8A | 35-8A | 36-8A | 37-8A |
| 2703 | 31-9A | 32-9A | 33-9A | 34-9A | 35-9A | 36-9A | 37-9A |
| 2704 | 31-10A | 32-10A | 33-10A | 34-10A | 35-10A | 36-10A | 37-10A |
| 2705 | 31-11A | 32-11A | 33-11A | 34-11A | 35-11A | 36-11A | 37-11A |
| 2706 | 31-12A | 32-12A | 33-12A | 34-12A | 35-12A | 36-12A | 37-12A |

TABLE 1B

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| Layer (I) | | | | | | |
| First layer region (G) | $GeF_4/He = 0.5$<br>$SiF_4/He = 0.5$<br>$H_2$ | $GeF_4 + SiF_4 = 200$ | $\frac{(GeF_4 + SiF_4)}{(GeF_4 + SiF_4 + H_2)} = 7/10$<br><br>$\frac{GeF_4}{(GeF_4 + SiF_4 + H_2)} = 1/100$ | 0.18 | 15 | 3 |
| Second layer region (S) | $SiH_4/He = 0.5$<br>$B_2H_6/He = 1 \times 10^{-3}$<br>$(PH_3/He = 1 \times 10^{-3})$ | $SiH_4 = 200$ | $\frac{B_2H_6}{SiH_4} = (*)$ | 0.18 | 15 | 25 |
| Layer (II) | $SiH_4/He = 0.5$<br>$C_2H_4$ | $SiH_4 = 100$ | $SiH_4/C_2H_4 = 3/7$ | 0.18 | 10 | 0.5 |

(*): Flow rate ratio was changed according to the change rate curve previously designed.

TABLE 3B

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| Layer (I) | | | | | | |
| First layer region (G) | $GeF_4/He = 0.5$<br>$SiF_4/He = 0.5$<br>$H_2$<br>$B_2H_6/He = 1 \times 10^{-3}$ | $GeF_4 + SiF_4 = 200$ | $\frac{(GeF_4 + SiF_4)}{(GeF_4 + SiF_4 + H_2)} = 7/10$<br><br>$\frac{GeF_4}{(GeF_4 + SiF_4 + H_2)} = 1/100$<br><br>$\frac{B_2H_6}{(GeF_4 + SiF_4)} = (*)$ | 0.18 | 15 | 3 |
| Second layer region (S) | $SiH_4/He = 0.5$<br>$B_2H_6/He = 1 \times 10^{-3}$<br>$(PH_3/He = 1 \times 10^{-3})$ | $SiH_4 = 200$ | $\frac{B_2H_6}{SiH_4} = (**)$ | 0.18 | 15 | 25 |
| Layer (II) | $SiH_4/He = 0.5$<br>$C_2H_4$ | $SiH_4 = 100$ | $SiH_4/C_2H_4 = 3/7$ | 0.18 | 10 | 0.5 |

(*), (**): Flow rate ratio was changed according to the change rate curve previously designed.

TABLE 5B

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| Layer (I) | | | | | | |
| First layer region (G) | $GeH_4/He = 0.5$<br>$SiH_4/He = 0.5$<br>$(B_2H_6/He = 1 \times 10^{-3})$<br>$H_2$ | $SiH_4 + GeH_4 = 200$ | $\frac{GeH_4}{(GeH_4 + SiH_4 + H_2)} = (*)$<br><br>$\frac{B_2H_6}{(GeH_4 + SiH_4)} = (**)$ | 0.18 | 15 | 3 |

TABLE 5B-continued

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\frac{B_2H_6}{SiH_4}$ = (***) | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (), (*): Flow rate ratio was changed according to the change rate curve previously designed.

TABLE 6B

| Depth profile of impurity atoms | Depth profile of Ge | | | | | | |
|---|---|---|---|---|---|---|---|
| | 2801 | 2802 | 2803 | 2804 | 2805 | 2806 | 2807 |
| | Sample No. | | | | | | |
| 2601 | 31-1B | 32-1B | 33-1B | 34-1B | 35-1B | 36-1B | 37-1B |
| 2602 | 31-2B | 32-2B | 33-2B | 34-2B | 35-2B | 36-2B | 37-2B |
| 2603 | 31-3B | 32-3B | 33-3B | 34-3B | 35-3B | 36-3B | 37-3B |
| 2604 | 31-4B | 32-4B | 33-4B | 34-4B | 35-4B | 36-4B | 37-4B |
| 2605 | 31-5B | 32-5B | 33-5B | 34-5B | 35-5B | 36-5B | 37-5B |
| 2606 | 31-6B | 32-6B | 33-6B | 34-6B | 35-6B | 36-6B | 37-6B |
| 2701 | 31-7B | 32-7B | 33-7B | 34-7B | 35-7B | 36-7B | 37-7B |
| 2702 | 31-8B | 32-8B | 33-8B | 34-8B | 35-8B | 36-8B | 37-8B |
| 2703 | 31-9B | 32-9B | 33-9B | 34-9B | 35-9B | 36-9B | 37-9B |
| 2704 | 31-10B | 32-10B | 33-10B | 34-10B | 35-10B | 36-10B | 37-10B |
| 2705 | 31-11B | 32-11B | 33-11B | 34-11B | 35-11B | 36-11B | 37-11B |
| 2706 | 31-12B | 32-12B | 33-12B | 34-12B | 35-12B | 36-12B | 37-12B |

TABLE 7B

| Condition | Gases employed | Flow rate (SCCM) | Flow rate ratio or Area ratio | Discharging power (W/cm$^2$) | Layer thickness ($\mu$) |
|---|---|---|---|---|---|
| 7-1B | Ar | 200 | Si wafer:graphite = 1.5:8.5 | 0.3 | 0.5 |
| 7-2B | Ar | 200 | Si wafer:graphite = 0.5:9.5 | 0.3 | 0.3 |
| 7-3B | Ar | 200 | Si wafer:graphite = 6:4 | 0.3 | 1.0 |
| 7-4B | SiH$_4$/He = 1<br>C$_2$H$_4$ | SiH$_4$ = 15 | SiH$_4$:C$_2$H$_4$ = 0.4:9.6 | 0.18 | 0.3 |
| 7-5B | SiH$_4$/He = 0.5<br>C$_2$H$_4$ | SiH$_4$ = 100 | SiH$_4$:C$_2$H$_4$ = 5:5 | 0.18 | 1.5 |
| 7-6B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 7-7B | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 7-8B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 8

| Layer (II) forming conditions | Sample No./Evaluation | | |
|---|---|---|---|
| 7-1B | 1-1-1B ○ ○ | 2-1-1B ○ ○ | 3-1-1B ○ ○ |
| 7-2B | 1-1-2B ○ ○ | 2-1-2B ○ ○ | 3-1-2B ○ ○ |
| 7-3B | 1-1-3B ○ ○ | 2-1-3B ○ ○ | 3-1-3B ○ ○ |
| 7-4B | 1-1-4B ◉ ◉ | 2-1-4B ◉ ◉ | 3-1-4B ◉ ◉ |
| 7-5B | 1-1-5B ◉ ◉ | 2-1-5B ◉ ◉ | 3-1-5B ◉ ◉ |
| 7-6B | 1-1-6B ◉ ◉ | 2-1-6B ◉ ◉ | 3-1-6B ◉ ◉ |
| 7-7B | 1-1-7B ○ ○ | 2-1-7B ○ ○ | 3-1-7B ○ ○ |
| 7-8B | 1-1-8B ○ ○ | 2-1-8B ○ ○ | 3-1-8B ○ ○ |
| Sample No. | | | |
| Overall image | Durability | | |
| quality evaluation | evaluation | | |

Evaluation standards:
◉ .. Excellent
○ ... Good

TABLE 9B

| Sample No. | 901B | 902B | 903B | 904B | 905B | 906B | 907B |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image | Δ | ○ | ◉ | ◉ | ○ | Δ | X |

TABLE 9B-continued

| Sample No. | 901B | 902B | 903B | 904B | 905B | 906B | 907B |
|---|---|---|---|---|---|---|---|
| quality evaluation | | | | | | | |

⊚ : Very good
○ : Good
Δ: Sufficiently practically usable
X: Image defect formed

TABLE 10B

| Sample No. | 1001B | 1002B | 1003B | 1004B | 1005B | 1006B | 1007B | 1008B |
|---|---|---|---|---|---|---|---|---|
| $SiH_4:C_2H_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚ : Very good
○ : Good
Δ: Sufficiently practically usable
X: Image defect formed

TABLE 11B

| Sample No. | 1501B | 1502B | 1503B | 1504B | 1505B | 1506B | 1507B | 1508B |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊚ | ⊚ | ⊚ | ○ | Δ | X |

⊚ : Very good
○ : Good
Δ: Practically satisfactory
X: Image defect formed

TABLE 12B

| Sample No. | Thickness of layer (II) (μ) | Results |
|---|---|---|
| 1601B | 0.001 | Image defect liable to be formed |
| 1602B | 0.02 | No image defect formed up to successive copying for 20,000 times |
| 1603B | 0.05 | Stable up to successive copying for 50,000 times |
| 1604B | 1 | Stable up to successive copying for 200,000 times |

TABLE 1C

| Layer constitution | Gases employed | Flow rate (SCCM) | Flow rate ratio | Discharging power (W/cm²) | Layer formation speed (Å/sec) | Layer thickness (μ) |
|---|---|---|---|---|---|---|
| Layer (I) | | | | | | |
| First layer region (G) | $GeF_4/He = 0.5$ $SiF_4/He = 0.5$ $H_2$ | $GeF_4 + SiF_4 = 200$ | $\frac{(GeF_4 + SiF_4)}{(GeF_4 + SiF_4 + H_2)} = 7/10$ $\frac{GeF_4}{(GeF_4 + SiF_4 + H_2)} = 1/100$ | 0.18 | 15 | 3 |
| Second layer region (S) | $SiH_4/He = 0.5$ $B_2H_6/He = 1 \times 10^{-3}$ $(PH_3/He = 1 \times 10^{-3})$ | $SiH_4 = 200$ | $\frac{B_2H_6}{SiH_4} = (*)$ | 0.18 | 15 | 25 |
| Layer (II) | $SiH_4/He = 0.5$ NO | $SiH_4 = 100$ | $SiH_4/NO = 1$ | 0.18 | 10 | 0.5 |

(*): Flow rate ratio was changed according to the change rate curve previously designed.

TABLE 3C

| Layer constitution | Gases employed | Flow rate (SCCM) | Flow rate ratio | Discharging power (W/cm²) | Layer formation speed (Å/sec) | Layer thickness (μ) |
|---|---|---|---|---|---|---|
| Layer (I) | | | | | | |
| First layer region (G) | $GeF_4/He = 0.5$ $SiF_4/He = 0.5$ $H_2$ $B_2H_6/He = 1 \times 10^{-3}$ | $GeF_4 + SiF_4 = 200$ | $\frac{(GeF_4 + SiF_4)}{(GeF_4 + SiF_4 + H_2)} = 7/10$ $\frac{GeF_4}{(GeF_4 + SiF_4 + H_2)} = 1/100$ | 0.18 | 15 | 3 |

TABLE 3C-continued

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| | | | $\dfrac{B_2H_6}{(GeF_4 + SiF_4)} = (*)$ | | | |
| Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\dfrac{B_2H_6}{SiH_4} = (**)$ | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*), (**): Flow rate ratio was changed according to the change rate curve previously designed.

TABLE 5C

| Layer constitution | Gases employed | Flow rate (SCCM) | Flow rate ratio | Discharging power (W/cm$^2$) | Layer formation speed (Å/sec) | Layer thickness ($\mu$) |
|---|---|---|---|---|---|---|
| Layer (I) | | | | | | |
| First layer region (G) | GeH$_4$/He = 0.5<br>SiH$_4$/He = 0.5<br>(B$_2$H$_6$/He = 1 × 10$^{-3}$)<br>H$_2$ | SiH$_4$ + GeH$_4$ = 200 | $\dfrac{GeH_4}{(GeH_4 + SiH_4 + H_2)} = (*)$<br>$\dfrac{B_2H_6}{(GeH_4 + SiH_4)} = (**)$ | 0.18 | 15 | 3 |
| Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\dfrac{B_2H_6}{SiH_4} = (***)$ | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*), (), (*): Flow rate ratio was changed according to the change rate curve previously designed.

TABLE 6C

| Depth profile of impurity atoms | Depth profile of Ge | | | | | | |
|---|---|---|---|---|---|---|---|
| | 2801 | 2802 | 2803 | 2804 | 2805 | 2806 | 2807 |
| | | | | Sample No. | | | |
| 2601 | 31-1C | 32-1C | 33-1C | 34-1C | 35-1C | 36-1C | 37-1C |
| 2602 | 31-2C | 32-2C | 33-2C | 34-2C | 35-2C | 36-2C | 37-2C |
| 2603 | 31-3C | 32-3C | 33-3C | 34-3C | 35-3C | 36-3C | 37-3C |
| 2604 | 31-4C | 32-4C | 33-4C | 34-4C | 35-4C | 36-4C | 37-4C |
| 2605 | 31-5C | 32-5C | 33-5C | 34-5C | 35-5C | 36-5C | 37-5C |
| 2606 | 31-6C | 32-6C | 33-6C | 34-6C | 35-6C | 36-6C | 37-6C |
| 2701 | 31-7C | 32-7C | 33-7C | 34-7C | 35-7C | 36-7C | 37-7C |
| 2702 | 31-8C | 32-8C | 33-8C | 34-8C | 35-8C | 36-8C | 37-8C |
| 2703 | 31-9C | 32-9C | 33-9C | 34-9C | 35-9C | 36-9C | 37-9C |
| 2704 | 31-10C | 32-10C | 33-10C | 34-10C | 35-10C | 36-10C | 37-10C |
| 2705 | 31-11C | 32-11C | 33-11C | 34-11C | 35-11C | 36-11C | 37-11C |
| 2706 | 31-12C | 32-12C | 33-12C | 34-12C | 35-12C | 36-12C | 37-12C |

TABLE 7C

| Condition | Gases employed | Flow rate (SCCM) | Flow rate ratio or Area ratio | Discharging power (W/cm$^2$) | Layer thickness ($\mu$) |
|---|---|---|---|---|---|
| 7-1C | Ar(NO/Ar) | 200(1/1) | Si wafer:SiO$_2$ = 1:30 | 0.3 | 0.5 |
| 7-2C | Ar(NO/Ar) | 200(1/1) | Si wafer:SiO$_2$ = 1:60 | 0.3 | 0.5 |
| 7-3C | Ar(NO/Ar) | 200(1/1) | Si wafer:SiO$_2$ = 1:0 | 0.3 | 1.0 |
| 7-4C | SiH$_4$/He = 1<br>NO | SiH$_4$ = 15 | SiH$_4$:NO = 5:1 | 0.18 | 0.3 |
| 7-5C | SiH$_4$/He = 0.5<br>NO | SiH$_4$ = 100 | SiH$_4$:NO = 1:1 | 0.18 | 1.5 |
| 7-6C | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 7-7C | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 7-8C | SiH$_4$/He = 0.5 | SiH$_4$ + SiF$_4$ = 150 | SiH$_4$:SiF$_4$:NO = | 0.18 | 1.5 |

TABLE 7C-continued

| Condition | Gases employed | Flow rate (SCCM) | Flow rate ratio or Area ratio | Discharging power (W/cm$^2$) | Layer thickness ($\mu$) |
|---|---|---|---|---|---|
| | SiF$_4$/He = 0.5 NO | | 1:1:3 | | |

TABLE 8C

| Layer (II) forming conditions | Sample No./Evaluation | | | |
|---|---|---|---|---|
| 7-1C | 1-1-1C ○ ○ | 1-2-1C ○ ○ | 1-3-1C ○ ○ | |
| 7-2C | 1-1-2C ○ ○ | 1-2-2C ○ ○ | 1-3-2C ○ ○ | |
| 7-3C | 1-1-3C ○ ○ | 1-2-3C ○ ○ | 1-3-3C ○ ○ | |
| 7-4C | 1-1-4C ⊙ ⊙ | 1-2-4C ⊙ ⊙ | 1-3-4C ⊙ ⊙ | |
| 7-5C | 1-1-5C ⊙ ⊙ | 1-2-5C ⊙ ⊙ | 1-3-5C ⊙ ⊙ | |
| 7-6C | 1-1-6C ⊙ ⊙ | 1-2-6C ⊙ ⊙ | 1-3-6C ⊙ ⊙ | |
| 7-7C | 1-1-7C ○ ○ | 1-2-7C ○ ○ | 1-3-7C ○ ○ | |
| 7-8C | 1-1-8C ○ ○ | 1-2-8C ○ ○ | 1-3-8C ○ ○ | |

Sample No.
Overall image quality evaluation    Durability evaluation
Evaluation standards:
⊙: Excellent
○: Good

TABLE 9C

| Sample No. | 901C | 902C | 903C | 904C | 905C | 906C | 907C |
|---|---|---|---|---|---|---|---|
| Si:SiO$_2$ Target | 9:1 (0/1) | 6.5:3.5 (1/1) | 4:10 (1/1) | 2:60 (1/1) | 1:100 (2/1) | 1:100 (3/1) | 1:100 (4/1) |
| (Area ratio) (NO/Ar) | | | | | | | |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ○ | ⊙ | ⊙ | ○ | Δ | X |

⊙: Very good
○: Good
Δ: Sufficiently practically usable
X: Image defect formed

TABLE 10C

| Sample No. | 1001C | 1002C | 1003C | 1004C | 1005C | 1006C | 1007C |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | ○ | ⊙ | ⊙ | ○ | Δ | X |

⊙: Very good
○: Good
Δ: Practically satisfactory
X: Image defect formed

TABLE 11C

| Sample No. | 1101C | 1102C | 1103C | 1104C | 1105C | 1106C | 1107C |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊙ | ⊙ | ○ | Δ | X |

⊙: Very good
○: Good
Δ: Practically satisfactory
X: Image defect formed

TABLE 12C

| Sample No. | Thickness of layer (II) ($\mu$) | Results |
|---|---|---|
| 1201C | 0.001 | Image defect liable to be formed |
| 1202C | 0.02 | No image defect formed up to successive copying for 20,000 times |
| 1203C | 0.05 | Stable up to successive copying for 50,000 times |
| 1204C | 1 | Stable up to successive copying for 200,000 times |

TABLE 1D

| Layer constitution | | Gases employed | Flow rate (SCCM) | Flow rate ratio | Discharging power (W/cm$^2$) | Layer formation speed (Å/sec) | Layer thickness ($\mu$) |
|---|---|---|---|---|---|---|---|
| Layer (I) | First layer region (G) | GeF$_4$/He = 0.5<br>SiF$_4$/He = 0.5 | GeF$_4$ + SiF$_4$ = 200 | $\frac{(GeF_4 + SiF_4)}{(GeF_4 + SiF_4 + H_2)} = 7/10$ | 0.18 | 15 | 3 |
| | | H$_2$ | | $\frac{GeF_4}{(GeF_4 + SiF_4 + H_2)} = 1/100$ | | | |
| | Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\frac{B_2H_6}{SiH_4} = (*)$ | 0.18 | 15 | 25 |
| Layer (II) | | SiH$_4$/He = 0.5 | SiH$_4$ = 100 | SiH$_4$/NH$_3$ = 1/30 | 0.18 | 10 | 0.5 |

(*): Flow rate ratio was changed according to the change rate curve previously designed.

TABLE 3D

| Layer constitution | | Gases employed | Flow rate (SCCM) | Flow rate ratio | Discharging power (W/cm$^2$) | Layer formation speed (Å/sec) | Layer thickness ($\mu$) |
|---|---|---|---|---|---|---|---|
| Layer (I) | First layer region (G) | GeF$_4$/He = 0.5<br>SiF$_4$/He = 0.5 | GeF$_4$ + SiF$_4$ = 200 | $\frac{(GeF_4 + SiF_4)}{(GeF_4 + SiF_4 + H_2)} = 7/10$ | 0.18 | 15 | 3 |
| | | H$_2$<br>B$_2$H$_6$/He = 1 × 10$^{-3}$ | | $\frac{GeF_4}{(GeF_4 + SiF_4 + H_2)} = 1/100$<br>$\frac{B_2H_6}{(GeF_4 + SiF_4)} = (*)$ | | | |
| | Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\frac{B_2H_6}{SiH_4} = (**)$ | 0.18 | 15 | 25 |
| Layer (II) | | SiH$_4$/He = 0.5, NH$_3$ | SiH$_4$ = 100 | SiH$_4$/NH$_3$ = 1/30 | 0.18 | 10 | 0.5 |

(*), (**): Flow rate ratio was changed according to the change rate curve previously designed.

TABLE 5D

| Layer constitution | | Gases employed | Flow rate (SCCM) | Flow rate ratio | Discharging power (W/cm$^2$) | Layer formation speed (Å/sec) | Layer thickness ($\mu$) |
|---|---|---|---|---|---|---|---|
| Layer (I) | First layer region (G) | GeH$_4$/He = 0.5<br>SiH$_4$/He = 0.5 | SiH$_4$ + GeH$_4$ = 200 | $\frac{GeH_4}{(GeH_4 + SiH_4 + H_2)} = (*)$ | 0.18 | 15 | 3 |
| | | (B$_2$H$_6$/He = 1 × 10$^{-3}$)<br>H$_2$ | | $\frac{B_2H_6}{(GeH_4 + SiH_4)} = (**)$ | | | |
| | Second layer region (S) | SiH$_4$/He = 0.5<br>B$_2$H$_6$/He = 1 × 10$^{-3}$<br>(PH$_3$/He = 1 × 10$^{-3}$) | SiH$_4$ = 200 | $\frac{B_2H_6}{SiH_4} = (***)$ | 0.18 | 15 | 25 |
| Layer (II) | | SiH$_4$/He = 0.5, NH$_3$ | SiH$_4$ = 100 | SiH$_4$/NH$_3$ = 1/30 | 0.18 | 10 | 0.5 |

(*), (), (*): Flow rate ratio was changed according to the change rate curve previously designed.

TABLE 6D

| | Depth profile of Ge | | | | | | |
|---|---|---|---|---|---|---|---|
| Depth profile of impurity atoms | 2801 | 2802 | 2803 | 2804 | 2805 | 2806 | 2807 |
| | | | | Sample No. | | | |
| 2601 | 31-1D | 32-1D | 33-1D | 34-1D | 35-1D | 36-1D | 37-1D |
| 2602 | 31-2D | 32-2D | 33-2D | 34-2D | 35-2D | 36-2D | 37-2D |
| 2603 | 31-3D | 32-3D | 33-3D | 34-3D | 35-3D | 36-3D | 37-3D |
| 2604 | 31-4D | 32-4D | 33-4D | 34-4D | 35-4D | 36-4D | 37-4D |
| 2605 | 31-5D | 32-5D | 33-5D | 34-5D | 35-5D | 36-5D | 37-5D |
| 2606 | 31-6D | 32-6D | 33-6D | 34-6D | 35-6D | 36-6D | 37-6D |
| 2701 | 31-7D | 32-7D | 33-7D | 34-7D | 35-7D | 36-7D | 37-7D |
| 2702 | 31-8D | 32-8D | 33-8D | 34-8D | 35-8D | 36-8D | 37-8D |
| 2703 | 31-9D | 32-9D | 33-9D | 34-9D | 35-9D | 36-9D | 37-9D |
| 2704 | 31-10D | 32-10D | 33-10D | 34-10D | 35-10D | 36-10D | 37-10D |
| 2705 | 31-11D | 32-11D | 33-11D | 34-11D | 35-11D | 36-11D | 37-11D |
| 2706 | 31-12D | 32-12D | 33-12D | 34-12D | 35-12D | 36-12D | 37-12D |

TABLE 7D

| Condition | Gases employed | Flow rate (SCCM) | Flow rate ratio or Area ratio | Discharging power (W/cm$^2$) | Layer thickness ($\mu$) |
|---|---|---|---|---|---|
| 7-1D | Ar(NH$_3$/Ar) | 200(1/1) | Si wafer:Silicon nitride = 1:30 | 0.3 | 0.5 |
| 7-2D | Ar(NH$_3$/Ar) | 200(1/1) | Si wafer:Silicon nitride = 1:30 | 0.3 | 0.3 |
| 7-3D | Ar(NH$_3$/Ar) | 200(1/1) | Si wafer:Silicon nitride = 6:4 | 0.3 | 1.0 |
| 7-4D | SiH$_4$/He = 1 NH$_3$ | SiH$_4$ = 15 | SiH$_4$:NH$_3$ = 1:100 | 0.18 | 0.3 |
| 7-5D | SiH$_4$/He = 0.5 NH$_3$ | SiH$_4$ = 100 | SiH$_4$:NH$_3$ = 1:30 | 0.18 | 1.5 |
| 7-6D | SiH$_4$/He = 0.5 SiF$_4$/He = 0.5 NH$_3$ | SiH$_4$ + SiF$_4$ = 150 | SiH$_4$:SiF$_4$:NH$_3$ = 1:1:60 | 0.18 | 0.5 |
| 7-7D | SiH$_4$/He = 0.5 SiF$_4$/He = 0.5 NH$_3$ | SiH$_4$ + SiF$_4$ = 15 | SiH$_4$:SiF$_4$:NH$_3$ = 2:1:90 | 0.18 | 0.3 |
| 7-8D | SiH$_4$/He = 0.5 SiF$_4$/He = 0.5 NH$_3$ | SiH$_4$ + SiF$_4$ = 150 | SiH$_4$:SiF$_4$:NH$_3$ = 1:1:20 | 0.18 | 1.5 |

TABLE 8D

| Layer (II) forming conditions | Sample No./Evaluation | | |
|---|---|---|---|
| 8-1D | 1-1-1D ⊙ ⊙ | 1-2-1D ⊙ ⊙ | 1-3-1D ⊙ ⊙ |
| 8-2D | 1-1-2D ⊙ ⊙ | 1-2-2D ⊙ ⊙ | 1-3-2D ⊙ ⊙ |
| 8-3D | 1-1-3D ⊙ ⊙ | 1-2-3D ⊙ ⊙ | 1-3-3D ⊙ ⊙ |
| 8-4D | 1-1-4D ⊚ ⊚ | 1-2-4D ⊚ ⊚ | 1-3-4D ⊚ ⊚ |
| 8-5D | 1-1-5D ⊚ ⊚ | 1-2-5D ⊚ ⊚ | 1-3-5D ⊚ ⊚ |
| 8-6D | 1-1-6D ⊚ ⊚ | 1-2-6D ⊚ ⊚ | 1-3-6D ⊚ ⊚ |
| 8-7D | 1-1-7D ⊙ ⊙ | 1-2-7D ⊙ ⊙ | 1-3-7D ⊙ ⊙ |
| 8-8D | 1-1-8D ⊙ ⊙ | 1-2-8D ⊙ ⊙ | 1-3-8D ⊙ ⊙ |

Sample No.

Overall image quality evaluation  Durability evaluation

Evaluation standards:
⊚ : Excellent
⊙ : Good

TABLE 9D

| Sample No. | 901D | 902D | 903D | 904D | 905D | 906D | 907D |
|---|---|---|---|---|---|---|---|
| Si:Si$_3$N$_4$ Target (Area ratio) (NH$_3$/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:N (Content ratio) | 9.7:0.3 | 8.8:1.2 | 7.3:2.7 | 5.0:5.0 | 4.5:5.5 | 4:6 | 3:7 |
| Image quality evaluation | Δ | ⊚ | ⊚ | ⊙ | ⊙ | Δ | X |

⊚ : Very good
⊙ : Good
Δ: Sufficiently practically usable
X: Image defect formed

TABLE 10D

| Sample No. | 1001D | 1002D | 1003D | 1004D | 1005D | 1006D | 1007D | 1008D |
|---|---|---|---|---|---|---|---|---|
| SiH$_4$:NH$_3$ (Flow rate ratio) | 9:1 | 1:3 | 1:10 | 1:30 | 1:100 | 1:1000 | 1:5000 | 1:10000 |
| Si:N (Content ratio) | 9.99:0.01 | 9.9:0.1 | 8.5:1.5 | 7.1:2.9 | 5:5 | 4.5:5.5 | 4:6 | 3.5:6.5 |
| Image quality evaluation | Δ | ⊚ | ⊚ | ⊚ | ⊙ | Δ | Δ | X |

⊚ : Very good
⊙ : Good
Δ: Practically satisfactory
X: Image defect formed

TABLE 11D

| Sample No. | 1101D | 1102D | 1103D | 1104D | 1105D | 1106D | 1107D | 1108D |
|---|---|---|---|---|---|---|---|---|
| SiH$_4$:SiF$_4$:NH$_3$ (Flow rate ratio) | 5:4:1 | 1:1:6 | 1:1:20 | 1:1:60 | 1:2:300 | 2:1:3000 | 1:1:10000 | 1:1:20000 |
| Si:N (Content ratio) | 9.89:0.11 | 9.8:0.2 | 8.4:1.6 | 7.0:3.0 | 5.1:4.9 | 4.6:5.4 | 4.1:5.9 | 3.6:6.4 |
| Image quality evaluation | Δ | ⊚ | ⊚ | ⊚ | ⊙ | Δ | Δ | X |

⊚ : Very good
⊙ : Good
Δ: Practically satisfactory
X: Image defect formed

TABLE 12D

| Sample No. | Thickness of layer (II) (μ) | Results |
| --- | --- | --- |
| 1201D | 0.001 | Image defect liable to be formed |
| 1202D | 0.02 | No image detect formed up to successive copying for 20,000 times |
| 1203D | 0.05 | Stable up to successive copying for 50,000 times |
| 1204D | 1 | Stable up to successive copying for 200,000 times |

We claim:

1. A photoconductive member comprising a substrate for photoconductive member and a light receiving layer provided on said substrate having a layer constitution in which a first layer region (G) comprising an amorphous material containing germanium atoms and at least one of hydrogen or halogen atoms and a second layer region (S) exhibiting photoconductivity comprising an amorphous material containing silicon atoms and at least one of hydrogen or halogen atoms are successively provided from the substrate side, said light receiving layer containing a substance for controlling conductivity (C) in a distributed state such that, in said light receiving layer, the maximum value of the content of said substance (C) in the layer thickness direction exists within said second layer region (S) or at the interface with said first layer region (G) and, in said second layer region (S), said substance (C) is distributed in greater amount on the side of said substrate.

2. A photoconductive member according to claim 1, wherein silicon atoms are contained in the first layer region (G).

3. A photoconductive member according to claim 1, wherein the germanium atoms are distibuted in the first layer region (G) ununiformly in the layer thickness direction.

4. A photoconductive member according to claim 1, wherein the germanium atoms are distibuted in the first layer region (G) uniformly in the layer thickness direction.

5. A photoconductive member according to claim 1, wherein hydrogen atoms are contained in at least one of the first layer region (G) and the second layer region (S).

6. A photoconductive member according to claim 1, wherein halogen atoms are contained in at least one of the first layer region (G) and the second layer region (S).

7. A photoconductive member according to claim 5, wherein halogen atoms are contained in at least one of the first layer region (G) and the second layer region (S).

8. A photoconductive member according to claim 2, wherein germanium atoms are distributed in the first layer region (G) more enriched on the side of said substrate.

9. A photoconductive member according to claim 1, wherein the substance for controlling conductivity (C) is an atom belonging to the group III of the periodic table.

10. A photoconductive member according to claim 1, wherein the substance for controlling conductivity (C) is an atom belonging to the group V of the periodic table.

11. A photoconductive member according to claim 3, wherein the maximum value of the content Cmax in the layer thickness direction of germanium atoms in the first layer region (G) is 1000 atomic ppm or more based on the sum with silicon atoms in the first layer region (G).

12. A photoconductive member according to claim 1, wherein the amount of germanium atoms contained in the first layer region (G) is 1 to $1 \times 10^6$ atomic ppm.

13. A photoconductive member according to claim 1, wherein the first layer region (G) has a layer thickness $T_B$ of 30 Å to 50μ.

14. A photoconductive member according to claim 1, wherein the second layer region (S) has a layer thickness T of 0.5 to 90μ.

15. A photoconductive member according to claim 1, wherein the sum of the layer thickness TB of the first layer region (G) and the layer thickness T of the second layer region (S) is 1 to 100μ.

16. A photoconductive member according to claim 1, wherein there is the relationship between the layer thickness $T_B$ of the first layer region (G) and the layer thickness T of the second layer region (S) of $T_B/T \leq 1$.

17. A photoconductive member according to claim 1, wherein the layer thickness TB of the first layer region (G) is 30μ or less, when the content of germanium atoms contained in the first layer region (G) is $1 \times 10^5$ atomic ppm or more.

18. A photoconductive member according to claim 1, wherein 0.01 to 40 atomic % of hydrogen atoms are contained in the first layer region (G).

19. A photoconductive member according to claim 1, wherein 0.01 to 40 atomic % of halogen atoms are contained in the first layer region (G).

20. A photoconductive member according to claim 1, wherein 0.01 to 40 atomic % of hydrogen atoms and halogen atoms as the total are contained in the first layer region (G).

21. A photoconductive member according to claim 1, wherein the layer region (PN) containing the substance for controlling conductivity (C) comprises the end portion on the substrate side of the second layer region (S).

22. A photoconductive member according to claim 1, wherein the layer region (PN) containing the substance controlling conductivity (C) bridges both the first layer region (G) and the second layer region (S).

23. A photoconductive member according to claim 1, wherein the substance for controlling conductivity (C) is contained in the entire region of the second layer region (S).

24. A photoconductive member according to claim 22, wherein the maximum content of the substance for controlling conductivity C(G)max and C(S)max in the layer thickness direction in the first layer region (G) and the second layer region (S), respectively, satisfy the relationship of $C_{(G)max} < C_{(S)max}$.

25. A photoconductive member accoding to claim 9, wherein the atom belonging to the group III of the periodic table is selected from among B, Al, Ga, In and Tl.

26. A photoconductive member according to claim 10, wherein the atom belonging to the group V of the periodic table is selected from among P, As, Sb and Bi.

27. A photoconductive member according to claim 1, wherein the content of the substance for controlling conductivity (C) is 0.01 to $5 \times 10^4$ atomic ppm.

28. A photoconductive member comprising a substrate for photoconductive member and a light receiving layer provided on said substrate comprising a first layer (I) with a layer constitution in which a first layer region (G) comprising an amorphous material containing germanium atoms and a second layer region (S) exhibiting photoconductivity comprising an amorphous material containing silicon atoms are successively provided from the substrate side and a second layer (II) comprising an amorphous material containing silicon atoms and at least one atom selected from carbon atoms, oxygen atoms and nitrogen atoms, said first layer (I) containing a substance for controlling conductivity (C) in a distributed state such that the maximum value of the content of said substance (C) in the layer thickness direction exists within said second layer region (S) or at the interface with said first layer region (G) and, in said second layer region (S), said substance (C) is distributed in greater amount on the side of said substrate wherein the first layer region and second layer region each containing at least one of hydrogen and halogen atoms.

29. A photoconductive member according to claim 28, wherein silicon atoms are contained in the first layer region (G).

30. A photoconductive member according to claim 28, wherein the germanium atoms are distributed in the first layer region (G) ununiformly in the layer thickness direction.

31. A photoconductive member according to claim 28, wherein the germanium atoms are distibuted in the first layer region (G) uniformly in the layer thickness direction.

32. A photoconductive member according to claim 28, wherein hydrogen atoms are contained in at least one of first layer region (G) and the second layer region (S).

33. A photoconductive member according to claim 28, wherein halogen atoms are contained in at least one of the first layer region (G) and the second layer region (S).

34. A photoconductive member according to claim 32, wherein halogen atoms are contained in at least one of the first layer region (G) and the second layer region (S).

35. A photoconductive member according to claim 29, wherein germanium atoms are distributed in the first layer region (G) more enriched on the side of said substrate.

36. A photoconductive member according to claim 28, wherein the substance for controlling conductivity (C) is an atom belonging to the group III of the periodic table.

37. A photoconductive member according to claim 28, wherein the substance for controlling conductivity (C) is an atom belonging to the group V of the periodic table.

38. A photoconductive member according to claim 30, wherein the maximum value of the content Cmax in the layer thickness direction of germanium atoms in the first layer region (G) is 1000 atomic ppm or more based on the sum with silicon atoms in the first layer region (G).

39. A photoconductive member according to claim 28, wherein the amount of germanium atoms contained in the first layer region (G) is 1 to $1 \times 10^6$ atomic ppm.

40. A photoconductive member according to claim 28, wherein the first layer region (G) has a layer thickness $T_B$ of 30 Å to 50μ.

41. A photoconductive member according to claim 28, wherein the second layer region (S) has a layer thickness T of 0.5 to 90μ.

42. A photoconductive member according to claim 28, wherein the sum of the layer thickness TB of the first layer region (G) and the layer thickness T of the second layer region (S) is 1 to 100μ.

43. A photoconductive member according to claim 28, wherein there is the relationship between the layer thickness TB of the first layer region (G) and the layer thickness T of the second layer region (S) of $T_B/T \leq 1$.

44. A photoconductive member according to claim 28, wherein the layer thickenss $T_B$ of the first layer region (G) is 30μ or less, when the content of germanium atoms contained in the first layer region (G) is $1 \times 10^5$ atomic ppm or more.

45. A photoconductive member according to claim 28, wherein 0.01 to 40 atomic % of hydrogen atoms are contained in the first layer region (G).

46. A photoconductive member according to claim 28, wherein 0.01 to 40 atomic % of halogen atoms are contained in the first layer region (G).

47. A photoconductive member according to claim 28, wherein 0.01 to 40 atomic % of hydrogen atoms and halogen atoms as the total are contained in the first layer region (G).

48. A photoconductive member according to claim 28, wherein the layer region (PN) containing the substance for controlling conductivity (C) comprises the end portion on the substrate side of the second layer region (S).

49. A photoconductive member according to claim 28, wherein the layer region (PN) containing the substance for controlling conductivity (C) bridges both the first layer region (G) and the second layer region (S).

50. A photoconductive member according to claim 28, wherein the substance for contolling conductivity (C) is contained in the entire region of the second layer region (S).

51. A photoconductive member according to claim 49, wherein the maximum content of the substance for controlling conductivity $C_{(G)max}$ and $C_{(S)max}$ in the layer thickness direction in the first layer region (G) and the second layer region (S), respectively, satisfy the relationship of $C_{(G)max} < C_{(S)max}$.

52. A photoconductive member according to claim 36, wherein the atom belonging to the group III of the periodic table is selected from among B, Al, Ga, In and Tl.

53. A photoconductive member according to claim 37, wherein the atom belonging to the group V of the periodic table is selected from among P, As, Sb and Si.

54. A photoconductive member according to claim 28, wherein the content of the substance for controlling conductivity (C) is 0.01 to $5 \times 10^4$ atomic ppm.

55. A photoconductive member according to claim 28, wherein hydrogen atoms are contained in the second layer (II).

56. A photoconductive member according to claim 28, wherein halogen atoms are contained in the second layer (II).

57. A photoconductive member according to claim 28, wherein the amorphous material constituting the second layer (II) is selected from the amorphous materials represented by the following formulae:

  (A)

  (B)

  (C)

(where $0 < x$, $y < 1$, X is a halogen atom).

58. A photoconductive member according to claim 28, wherein the second layer has a layer thickness of 0.003 to 30μ.

UNITED STATES PATENT AND TRADEMARK OFFICE
CERTIFICATE OF CORRECTION

PATENT NO. : 4,609,604
DATED : September 2, 1986  Page 1 of 6
INVENTOR(S) : KEISHI SAITOH, ET AL.

It is certified that error appears in the above-identified patent and that said Letters Patent is hereby corrected as shown below:

COLUMN 1

Line 14,   "solid state" should read --solid-state--.
    Line 14,   "pickup" should read --pick-up--.
    Line 22,   "solid state" should read --solid-state--.
    Line 55,   "so called" should read --so-called--.

COLUMN 2

Line 26,   "impeded" should read --be impeded--.
    Line 36,   "solid state" should read --solid-state--.
    Line 42,   "so called" should read --so-called--.

COLUMN 4

Line 38,   "great" should read --greatly--.

COLUMN 5

Line 4,   "the all" should read --all the--.
    Line 8,   "distibution" should read distribution--.

COLUMN 6

Line 2,   "constantly" should read --constant--.

COLUMN 7

Line 22,   "characterisitcs" should read --characteristics--.

COLUMN 8

Line 60,   "so called" should read --so-called--.

UNITED STATES PATENT AND TRADEMARK OFFICE
CERTIFICATE OF CORRECTION

PATENT NO. : 4,609,604
DATED : September 2, 1986
INVENTOR(S) : KEISHI SAITOH, ET AL.

It is certified that error appears in the above-identified patent and that said Letters Patent is hereby corrected as shown below:

COLUMN 8

Line 65, "emplyment" should read --employment--.

COLUMN 9

Line 43, ", $SiHCl_3, SiH_2Br_2$," should read -- , $SiHCl_3$, $SiH_2Br_2$,--.

COLUMN 10

Line 9-10, "termperature" should read --temperature--.
Line 36, "contorlling" should read --controlling--.

COLUMN 11

Line 18, "At" should read --As--.
Line 19, "so called" should read --so-called--.
Line 37, "be selected" should read --selected--.

COLUMN 12

Line 34, "so called" should read --so-called--.
Line 39, "so called" should read --so-called--.
Line 57, "reveiving" should read --receiving--.
Line 65, "but no" should read --no-.

COLUMN 13

Line 45-46, "so as to be reduced from the interface position $t_0$" should be in normal type size.

UNITED STATES PATENT AND TRADEMARK OFFICE
CERTIFICATE OF CORRECTION

PATENT NO. : 4,609,604
DATED : September 2, 1986
INVENTOR(S) : KEISHI SAITOH, ET AL.

It is certified that error appears in the above-identified patent and that said Letters Patent is hereby corrected as shown below:

COLUMN 13

Line 66,   "either one" should read --any--.

COLUMN 14

Line 8,    "alyer" should read --layer--.
    Line 40,   "atomic" should read --atomic %--.
    Line 55,   "Typical" should read --Among typical--.
    Line 58,   "atoms boron" should read --atoms, boron--.

COLUMN 15

Line 34,   "elecgrophotography" should read
               --electrophotography--.
    Line 46,   "shematic" should read --schematic--.

COLUMN 16

Line 19,   "amophous" should read --amorphous--.
    Line 68,   "redily" should read --readily--.

COLUMN 18

Line 23,   "$C_4H_8$)" should read --$(C_4H_8)$--.

Line 28,   "inerhalogen" should read --interhalogen--.
    Line 29,   "halodies" should read --halides--.
    Line 42,   "The" should read --As the--.
    Line 55,   "The" should read --As the--.

COLUMN 19

Line 45,   "so called" should read --so-called--.

UNITED STATES PATENT AND TRADEMARK OFFICE
CERTIFICATE OF CORRECTION

PATENT NO. : 4,609,604
DATED : September 2, 1986
INVENTOR(S) : KEISHI SAITOH, ET AL.

It is certified that error appears in the above-identified patent and that said Letters Patent is hereby corrected as shown below:

COLUMN 21

Line 44,   "is in" should read --is, in--.

COLUMN 22

Line 16,   "amophous" should read --amorphous--.

COLUMN 23

Line 64,   "leading" should read --leaking--.
    Line 67,   "mass flow" should read --mass-flow--.

COLUMN 24

Line 51,   "uniformization" should read --uniformity--.

COLUMN 30

Line 14,   "were" should read --was--.

COLUMN 31

Line 58,   "PH" should read --$PH_3$--.

COLUMN 32

Line 41,   "0.2 se" should read --0.2 sec.--.
    Line 48,   "were" should read --was--.

COLUMN 39

Line 8,    ": Very good " should read -- ⊚: Very Good--
                   : Good                               o: Good

UNITED STATES PATENT AND TRADEMARK OFFICE
CERTIFICATE OF CORRECTION

PATENT NO. : 4,609,604
DATED : September 2, 1986       Page 5 of 6
INVENTOR(S) : KEISHI SAITOH, ET AL.

It is certified that error appears in the above-identified patent and that said Letters Patent is hereby corrected as shown below:

COLUMN 42

Line 56,  "0.5" should read --0.3--.

COLUMN 44

Line 18,  "o⊛⊛" should read --⊛ ⊛ o--.

COLUMN 49

Line 7,   "detect" should read --defect--.
    Line 37,  "distibuted" should read --distributed--.
    Line 41,  "distibuted" should read --distributed--.

COLUMN 50

Line 16,  "TB" should read --$T_B$--.
    Line 24,  "TB" should read --$T_B^B$--.

Line 52,  "C(G)max and C(S)max" should read --$C_{(G)max}$ and $C_{(S)max}$--.

Line 56,  "accoding" should read --according--.

COLUMN 51

Line 26,  "distibuted" should read --distributed--.
    Line 68,  "TB" should read --$T_B$--.

UNITED STATES PATENT AND TRADEMARK OFFICE
CERTIFICATE OF CORRECTION

PATENT NO. : 4,609,604
DATED : September 2, 1986
INVENTOR(S) : KEISHI SAITOH, ET AL.

Page 6 of 6

It is certified that error appears in the above-identified patent and that said Letters Patent is hereby corrected as shown below:

COLUMN 52

Line 5, "TB" should read --$T_B$--.

Line 31, "contolling" should read --controlling--.

Signed and Sealed this

Tenth Day of March, 1987

*Attest:*

DONALD J. QUIGG

*Attesting Officer*

*Commissioner of Patents and Trademarks*